United States Patent [19]

Vermilyea

[11] Patent Number: 4,935,714

[45] Date of Patent: Jun. 19, 1990

[54] LOW THERMAL CONDUCTANCE SUPPORT FOR A RADIATION SHIELD IN A MR MAGNET

[75] Inventor: Mark E. Vermilyea, Schenectady, N.Y.

[73] Assignee: General Electric Company, Schenectady, N.Y.

[21] Appl. No.: 215,111

[22] Filed: Jul. 5, 1988

[51] Int. Cl.$^5$ ................................................ H01F 7/22
[52] U.S. Cl. .................................... 335/299; 335/216; 324/318; 505/1
[58] Field of Search ................ 335/216, 299; 174/126, 174/15; 324/318

[56] References Cited

U.S. PATENT DOCUMENTS

| | | | |
|---|---|---|---|
| 4,492,090 | 1/1985 | Laskaris | 62/55 |
| 4,595,899 | 6/1986 | Smith et al. | 335/299 X |
| 4,652,824 | 3/1987 | Oppelt | 335/216 X |
| 4,721,934 | 1/1988 | Stacy | 335/300 |

Primary Examiner—George Harris
Attorney, Agent, or Firm—William H. Steinberg; James C. Davis, Jr.; Paul R. Webb, II

[57] ABSTRACT

A low thermal conductance support for a radiation shield in a magnetic resonance magnet is provided. Spacer means are situated partially in apertures in a cylindrical coil form having superconducting windings supported from a vacuum vessel. The spacer means are spaced away from the aperture walls and are secured at one end to the coil form. The spacer means protrude radially beyond the coil form surface and contact a radiation shield. The length of the spacer means is greater than the distance between the surface of the coil form and shield thereby increasing the thermal conduction path length between form and shield.

4 Claims, 27 Drawing Sheets

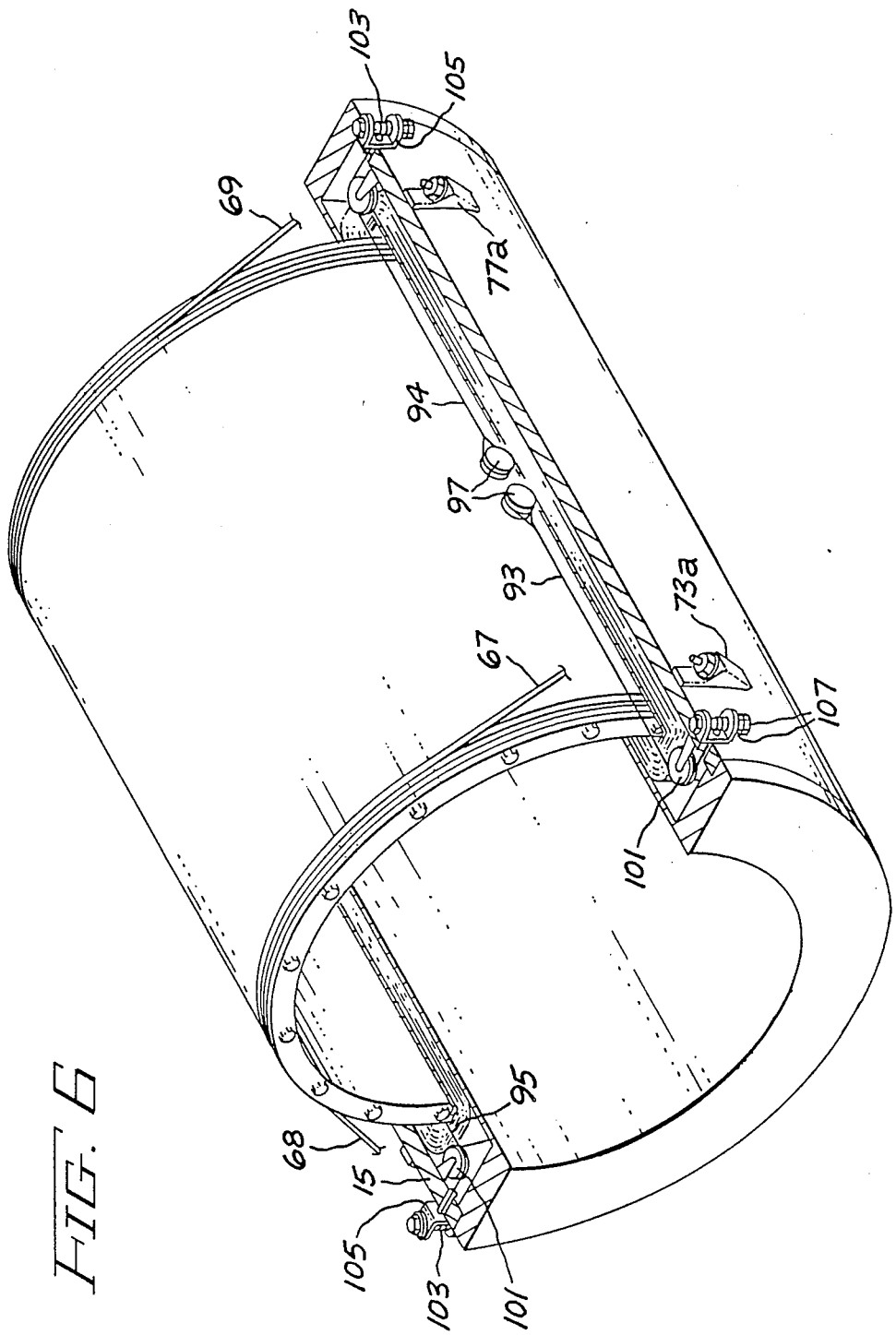

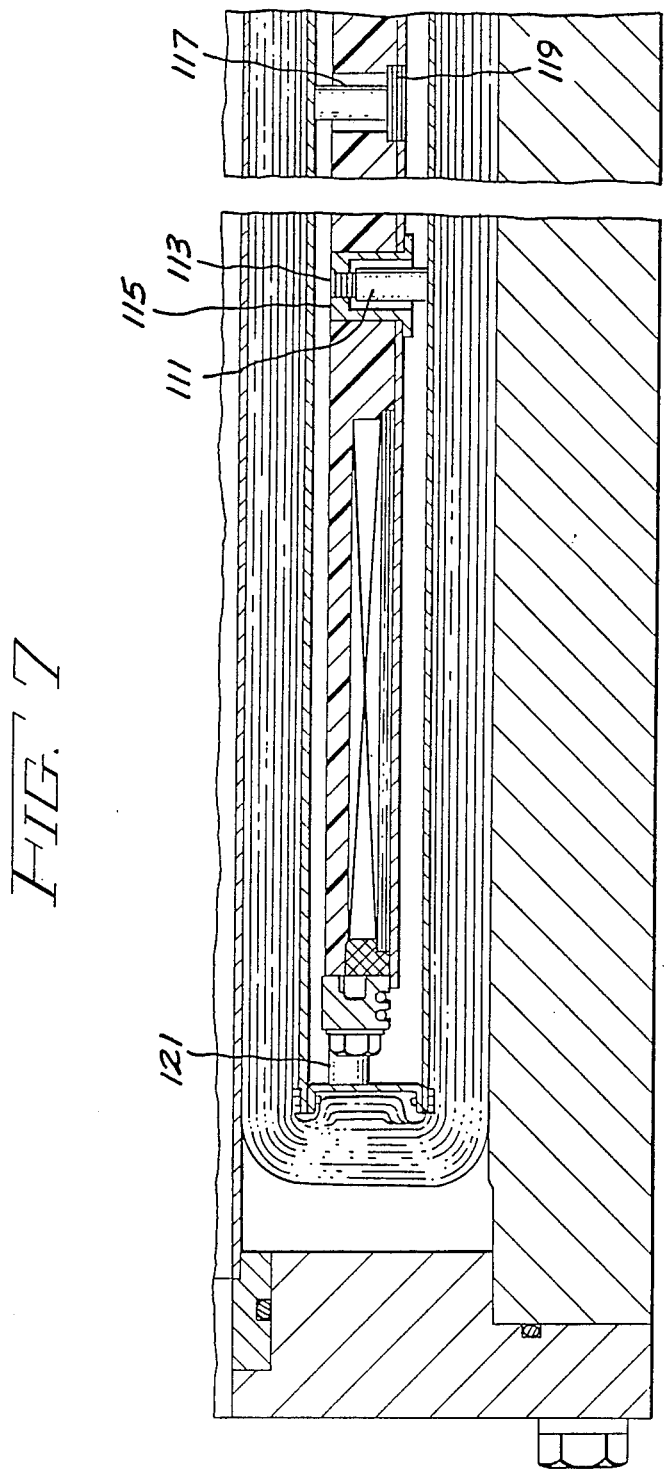

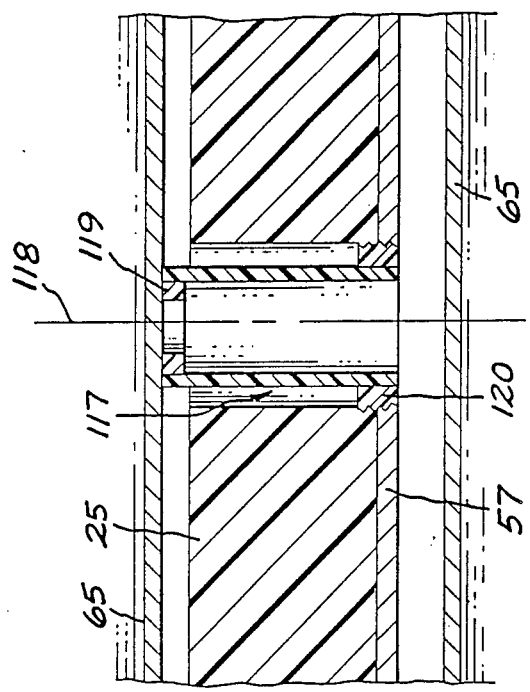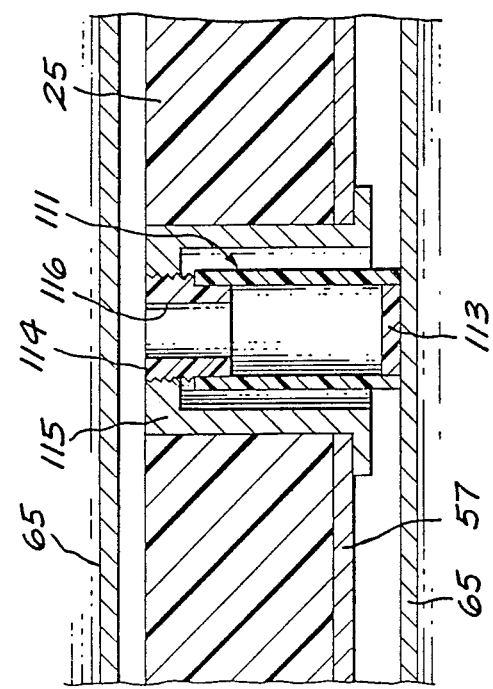

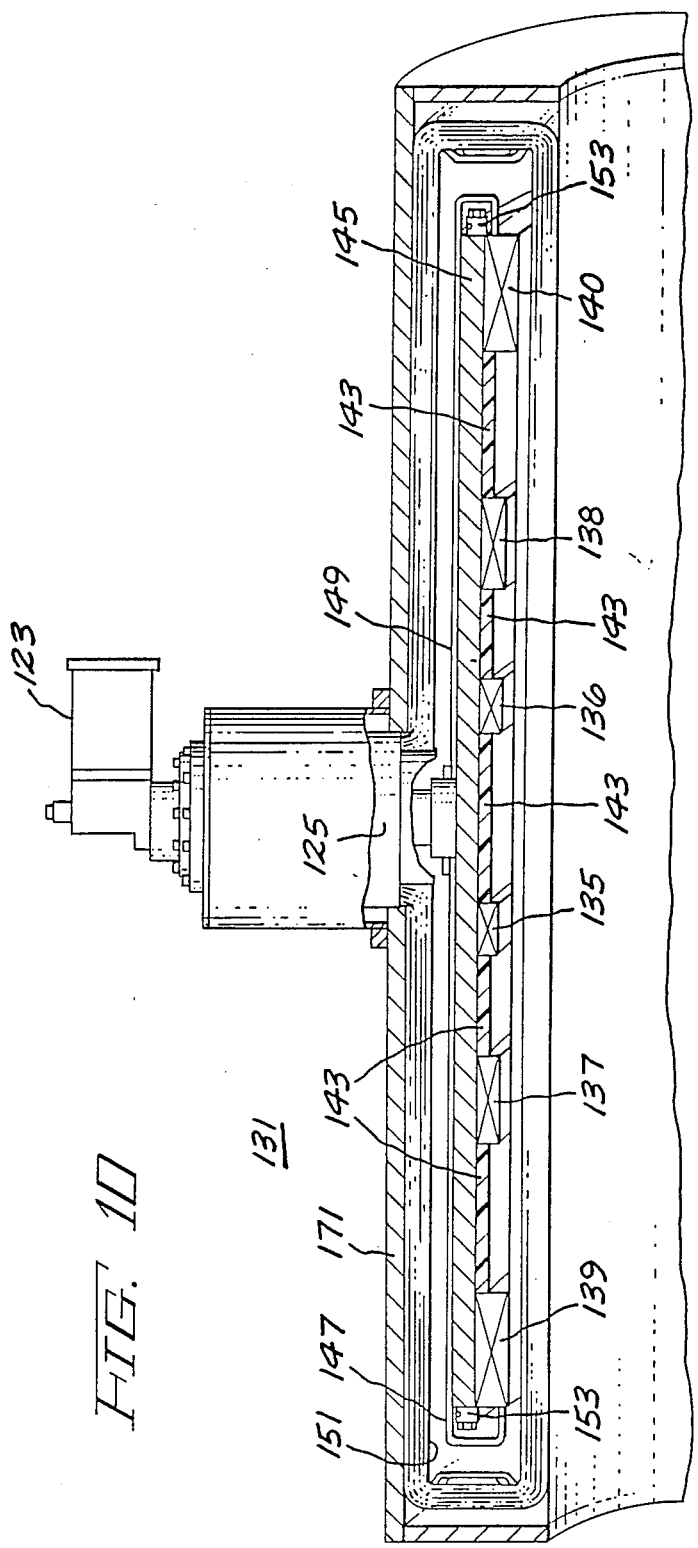

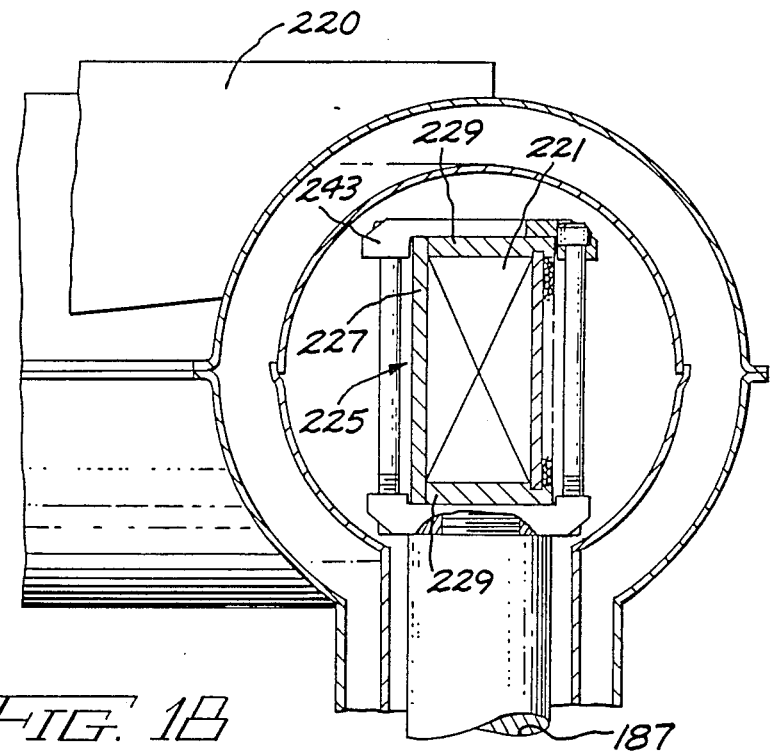
FIG. 18
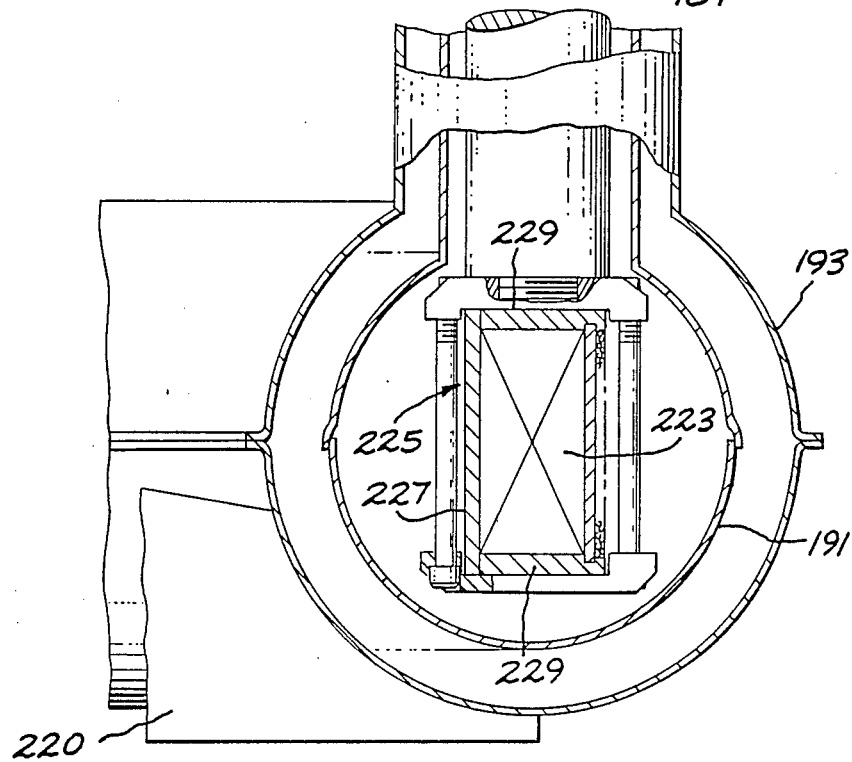

LOW THERMAL CONDUCTANCE SUPPORT FOR A RADIATION SHIELD IN A MR MAGNET

CROSS REFERENCE TO RELATED APPLICATIONS

The present invention is related to copending applications: Ceramic Superconductor Cryogenic Current Lead, Ser. No. 215,113 ; Superconductive Magnetic Resonance Magnet Without Cryogens, Ser. No. 215,165 ; Cryocooler Cold Head Receptacle, Ser. No. 215,114 ; Efficient Thermal Joints For Connecting Current Leads to a Cryocooler, Ser. No. 215,131 ; Cable Suspension System for Cylindrical Cryogenic Vessels, Ser. No. 215,477 ; and A Superconductive Quench Protected Magnet Coil, Ser. No. 215,479.

BACKGROUND OF THE INVENTION

This application relates to a support for a radiation shield in a superconducting magnetic resonance magnet.

In superconducting magnets the magnet windings are situated in a cryostat to thermally isolate the windings from exterior ambient conditions. To achieve the desired degree of thermal isolation, a thermal radiation shield surrounds the windings but is spaced apart therefrom. The shield and magnet are designed to operate at different temperatures with the magnet windings at the coldest temperature. The radiation shield needs to be supported with sufficient stability to withstand shipping loads yet limit heat transfer to the magnet windings.

All MR magnets have thermal shields to reduce the radiation heat input into the magnet windings. The shields are supported from a helium vessel which encloses the magnet windings or from the vacuum vessel. The supports are typically made of low thermal conductivity material such as fiberglass. The radial distance between the helium vessel and the surrounding shield are several inches allowing supports of at least this length.

In a magnet which does not have a helium vessel and relies on a cyrocooler to allow a superconductor winding such as niobium tin to operate superconductively, all the heat inputs from the thermal shield, suspension supports and conduction down the power leads has to be removed by the cryocooler. In a compact magnet design that operates using just a cyrocooler, space between the windings and the shield is limited and conduction heat from the shield supports to the windings which operate at different temperatures will raise the temperature of the windings. The shield supports need a sufficient cross sectional area to withstand the static and dynamic mechanical loads. However, spacers of sufficient cross sectional area having a short length create an excessive heat leak.

It is an object of the present invention to provide a low thermal conductance support operating in compression for a thermal shield in an MR magnet in which the radial distance between shield and the winding support is limited which can carry the shield mass in both static and dynamic modes with low heat leak to the magnet windings.

It is another object of the present invention to provide a low thermal conductance support for a thermal shield in an MR magnet.

It is a further object of the present invention to provide a low thermal conductance support operating in compression for a thermal shield in an MR magnet which allows easy assembly.

It is yet another object of the present invention to provide a low thermal conductance support operating in compression for a thermal shield in an MR magnet which has adjustment capability for moving the shield relative to the magnet windings.

SUMMARY OF THE INVENTION

In one aspect of the present invention a low thermal conductance support for a radiation shield in a magnetic resonance magnet is provided. Spacer means are situated partially in apertures in a cylindrical coil form having superconducting windings supported from a vacuum vessel. The spacer means are spaced away from the aperture walls and are secured at one end to the coil form. The spacer means protrude radially beyond the coil form surface and contact a radiation shield. The length of the spacer means is greater than the distance between the surface of the coil form and shield thereby increasing the thermal conduction path length between form and shield.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

FIG. 6 is an isometric view partly in section of the magnet of FIG. 1 showing the axial cable suspension;

FIG. 7 is a partial sectional elevation view of the spacers used in supporting the radiation shield from the coil form;

FIG. 8 is a sectional elevational view of a radially outwardly extending spacer;

FIG. 9 is a sectional elevational view of a radially inwardly extending spacer;

FIG. 10 is an axonometric view of part of a superconducting magnet partly in section;

FIG. 18 is a sectional view along the lines 18—18 of FIG. 16;

DETAILED DESCRIPTION OF THE INVENTION

Figure 1:
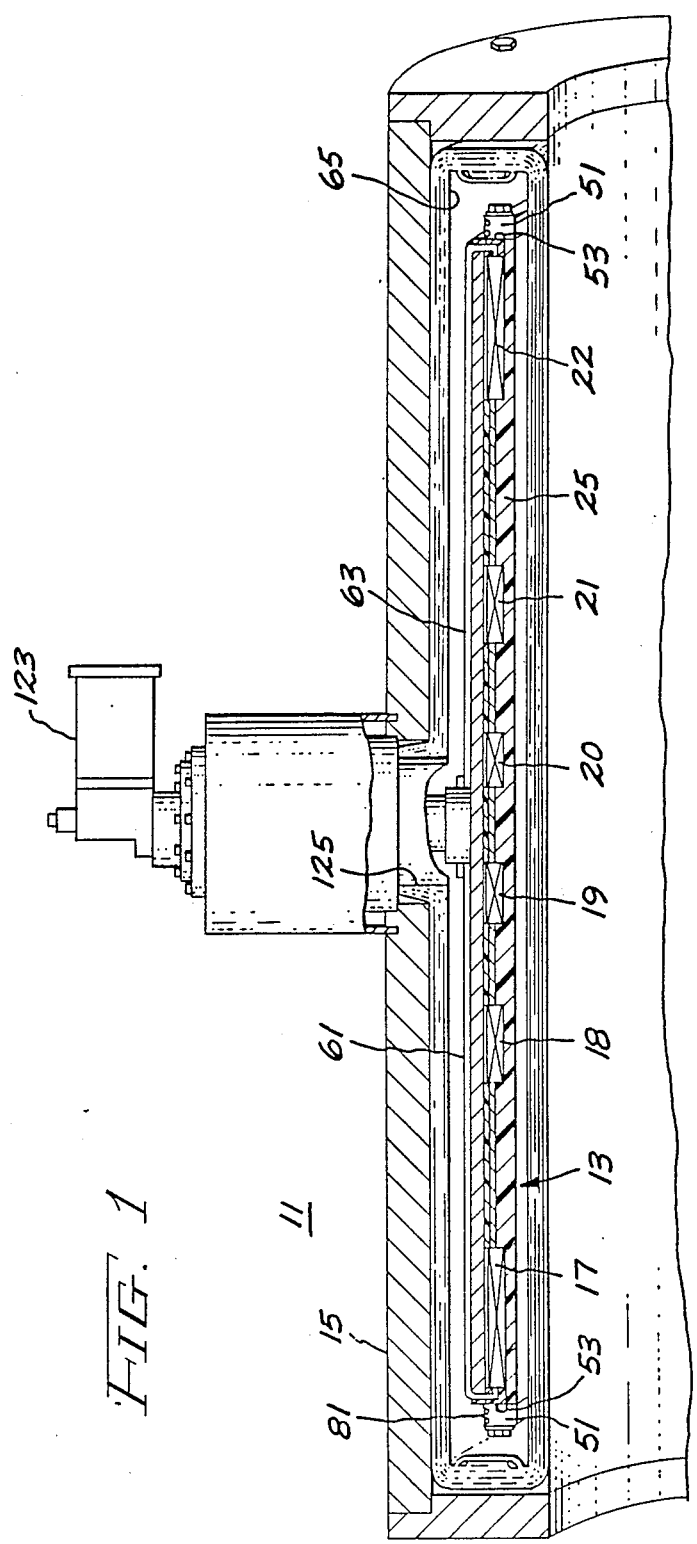
FIG. 1 is an axonometric view of part of superconducting magnet partly in section.
Figure 2:
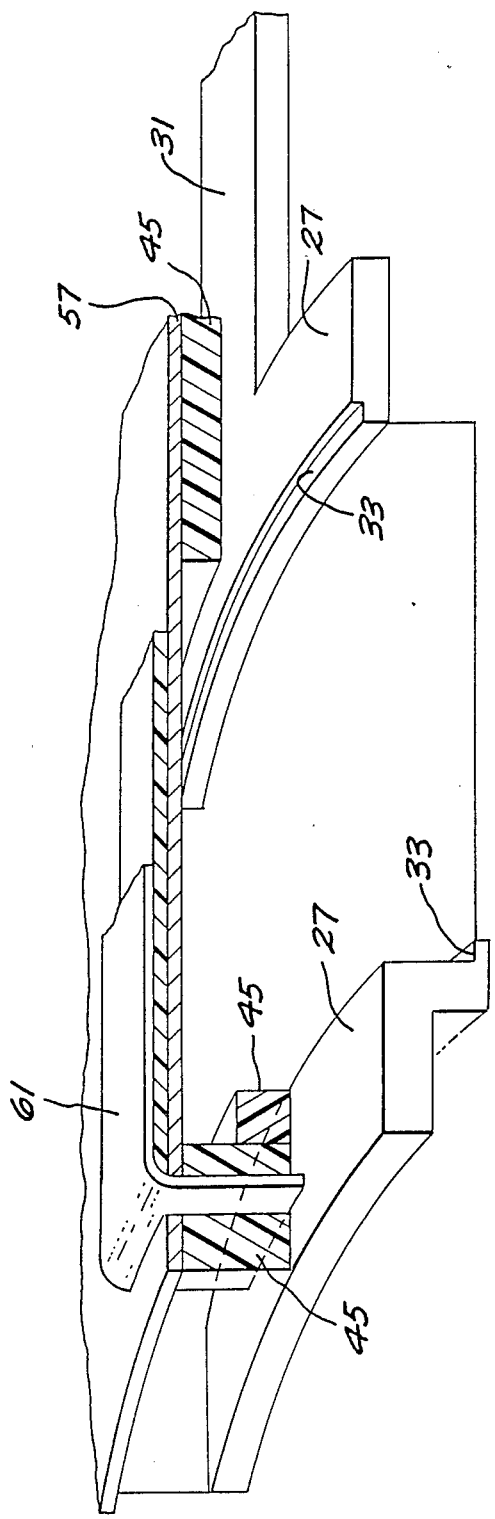
FIG. 2 is an axonometric view of the copper connectors used to connect the superconductor coils of FIG. 1.

Referring now to the drawing wherein like numerals indicate like elements throughout several embodiments of superconducting magnets without cryogens are shown. The magnets are designed to operate using a high temperature superconductor, namely niobium tin ($Nb_3Sn$) in the present embodiments. The magnets are directly cooled by a highly reliable two stage cryocooler, based on the Gifford McMahon cycle. In magnets of cylindrical shape operating at fields up to 1.5 T, the magnet geometry is arranged for the lowest possible peak magnetic flux density within the superconductor. This requirement is dictated by the intrinsic field versus current capability of $Nb_3Sn$ superconductor at elevated temperatures of 9° K. or above. Peak fields much above about 4 T cannot be accommodated with a reasonably high current density at 10° K. To lower the winding peak field, the winding current density must be reduced by using more fiberglass insulation or co-winding a strand of stabilizer for improved quench propagation and winding hoop strength. Since long thin coil modules have lower peak field than short thick ones, the windings are spread axially to take the shape of a long thin solenoid in the embodiments of FIGS. 1 and 10.

Figure 3:
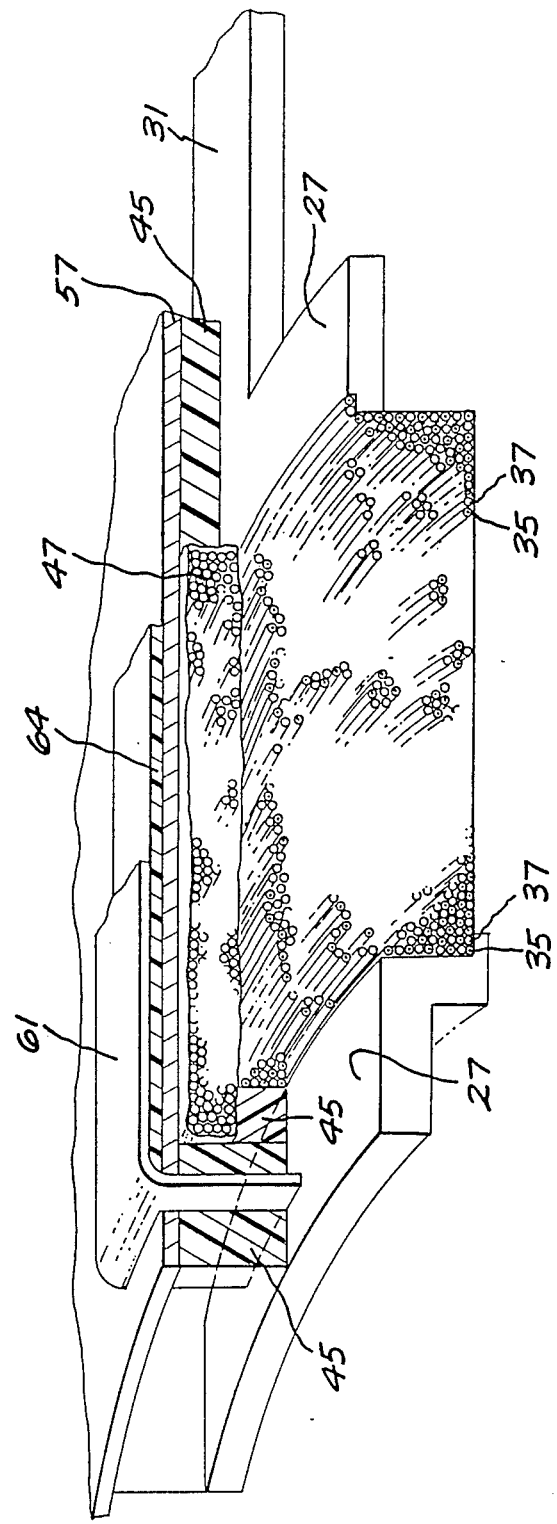
FIG. 3 is an axonometric view of the copper connection of FIG. 2 with the superconductor windings and overwrapping wire in place.
Figure 4:
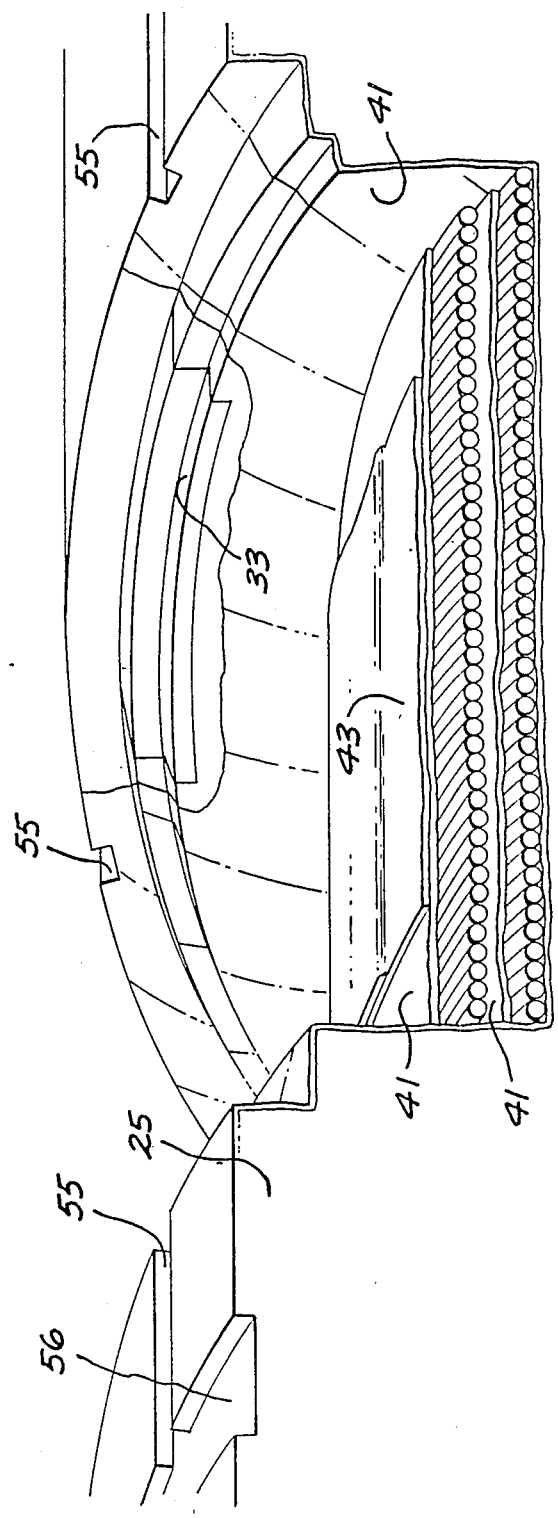
FIG. 4 is an axonometric view of a slot in the winding form of FIG. 1 showing a conductive foil loop surrounding a layer of windings.

Referring now to FIG. 1, a cylindrical magnetic resonance magnet 11 having an integral epoxy impregnated winding 13 in a shielded vacuum vessel 15 is shown. The six windings 17, 18, 29, 20, 21, and 22 are wound in slots symmetrically situated about the axial midplane of a cylindrical fiber reinforced form which in the present embodiment is a fiberglass form 25. Referring to FIGS. 1, 2, 3 and 4, the cylindrical fiberglass form 25 is fabricated as a uniform thickness shell and then machined to provide cutouts for copper connectors which have axially and circumferentially extending portions 31 and 27, respectively. The circumferential sections extend only partway around the coil form. Several lengths of superconductor wire can be soldered in a groove in the axial sections of the bus bar to reduce bus bar resistance during operation. Superconductive joints between niobium tin superconductors are difficult to be made. The copper connectors are used to join the six windings in series. The copper connectors are bonded to the fiberglass form 25 using epoxy. The fiberglass form is again machined with the copper connectors in place to provide six circumferentially extending winding slots with the circumferential portions of the connectors situated on either side of the slots. During the machining, ledges 33 are formed in the circumferentially extending copper connectors 27 at the bottom of the slot on one side and near the top of the slot on the other. A superconductor wire 35 which comprises niobium tin superconductors in a copper matrix and a strand of stabilizer 37, which comprises insulated copper wire in the present embodiment, are cowound in the slots. The $Nb_3Sn$ and copper wires are soldered to the ledge on the copper connector in the bottom of the slot to begin the winding and wound in layers separated by woven glass cloth 41 as shown in FIG. 4. The superconductor wire and stabilizer are preferably soldered together at every layer of the winding. The insulation is removed from the stabilizer prior to soldering and the connection reinsulated using tape, for example. The glass cloth is also used to line the slot prior to winding the coil also shown in FIG. 4. The windings in the slot terminate in a solder connection to the ledge 33 copper connector on the opposite side of the slot.

As shown in FIG. 4, distributed in the windings, every few layers, every third or fourth layer, for example, is a closed loop of copper foil 43. The copper foil is separated from the layer of windings above and below it by glass cloth insulation. The foil is overlapped and soldered so that it surrounds the winding, forming an electrically conductive loop. A portion of the loop is narrowed allowing the two wires being cowound to extend alongside the loop to begin the next layer. The number of closed loops of copper used in any winding is determined by several factors such as the amount of space available, the quench protected needed and cost. Axially extending copper connectors 31 couple adjacent circumferential copper connectors 27. Winding and terminating the superconductor in this fashion eliminates the need for any sharp angle turns at the beginning or end of each coil which could damage the superconductor wire. Co-winding with an insulated copper wire 35 controls the peak field and provides improved quench propagation. Filler pieces 45 situated above the copper connectors are bonded to the copper connectors by epoxy to provide a constant radius outer circumference diameter. The filler pieces can comprise G-10, for example. As shown in FIG. 3 the wound coils are overwrapped with stainless steel wire 47 to provide additional support against the Lorenz forces which act on the coils when the magnet is at full field.

A ring 51 of heat conductive material such as stainless steel is bolted to the ends of the coil form 25. The ring has a circumferential groove 53 which is aligned with axial slots in the fiberglass coil form shown in FIG. 4. The axial slots 55 extend the length of the coil form and are interconnected by circumferential slots 56 situated between windings on the form. A high heat conductivity nonmagnetic material such as copper is rolled around in the exterior of the coil form to form a shell 57 which can be seen in FIGS. 2 and 3. The shell is attached by overlapping and soldering the ends of the sheet together and by using high heat conductivity epoxy to secure the edges of the shell to the stainless steel rings 51. Electrolytic tough pitch (ETP) copper is preferred for use in the shell because of its high low-temperature thermal conductivity and a thermal contraction closely matching that of the fiberglass form 25. If an aluminum shell is used, the surface to be bonded to the fiberglass form is treated with a commercial chromate chemical-conversion coating, such as Alodine ® 1200 S a trademark of Amchem Products, Inc. Ambler, Pa., or similar process such as sodium dichromate-sulfuric acid method, or chromic acid-sulfuric acid method, or alcoholphosphoric acid method, or anodizing, to obtain good bonding to epoxy adhesives. Surface roughening, such as sand blasting or knurling may also be employed to further enhance bonding. The preferred method of surface treatment for a copper shell is Ebonol ® "C" special black cubric oxide coating, a trademark of Enthone, Inc., New Haven, Conn. Alternate methods include, ammonium persulfate process, or ferric chloride process, or hydrochloric acid-ferric chloride process, or sodium dichromate-sulfuric acid process.

Bus bars 61 and 63 are joined to the circumferential connectors 27 on either end of the coil form by soldering or using an indium pressure joint. The bus bars extend toward the midplane of coil on an insulator 64. The complete assembly of coils, coil form, rings and shell is vacuum impregnated with epoxy. The impregnation can take place with the assembly standing on end and the epoxy introduced at the lower end through a fitting in the ring 51 (not shown). The circumferential groove 53 in the ring 51 helps distribute the epoxy to all the axial channels 55 in the form. Additional circumferential grooves 56 help assure a good distribution of the epoxy throughout the interior of the windings and between the form 25 and the shell 57. After impregnation the magnet assembly is mounted inside the vacuum housing 15 surrounded by a radiation shield 65 which can be fabricated of copper or aluminum.

The bus bars in addition to carrying current between the coils provide a thermal bridge between the coils carrying heat generated during a quench from the interior of the resin impregnated coil to the adjacent coils increasing the speed at which the quench spreads to the other coils. The quicker the quench spreads the layer, the larger the area over which the magnet energy can be dissipated.

Figure 5:
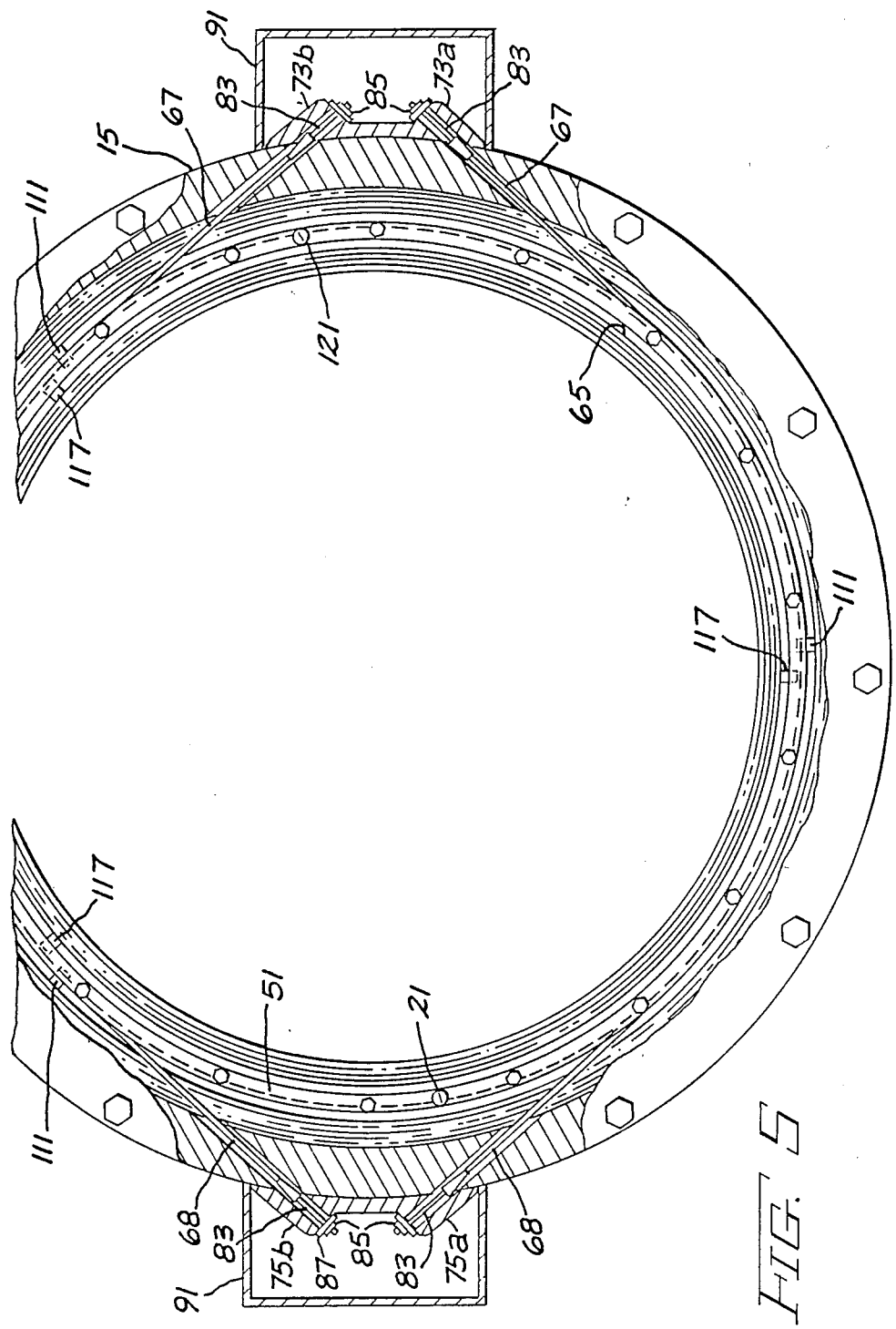
FIG. 5 is a partial end view partly in section of the magnet of FIG. 1 showing the radial cable suspension.

Referring now to FIGS. 1, 5 and 6, the coil form 25 is suspended in the shielded vacuum housing 15 by a radial and an axial cable suspension system. The radial suspension, which prevents radial movement of the coil form relative to the evacuable housing, has four cables 67, 68, 69 and 70 and eight cable tensioners arranged in pairs 73a and b, 75a and b, 77a and b, and 79a and b. The cable tensioners are affixed to the exterior of the housing 15. At each end of the evacuable housing, two pair of cable tensioners are used with each pair of cable tensioners located circumferentially spaced on either side of where an imaginary diametral line passing through the end rings 51 emerges through the evacuable housing. Each cable is attached at one end to a respective one of the cable tensioners in each pair and each cable extends through an aperture in the housing, through shield 65 and more than half way around the ring in a respective one of the grooves 81 in the outer surface of the rings. Each cable then passes through an opening in the shield and the housing and is secured to the other cable tensioner in the pair.

The cables can comprise $\frac{1}{4}$" stainless steel wire rope or a $\frac{1}{4}$" aramid fiber cable. The cables terminate in a threaded rod 83 which is secured to the cable by, for example, a swagged fitting. The cable tensioners comprise machined steel cable anchor extension which are welded to the steel housing. The cable anchor exterior has two openings for receiving a pair of threaded rods at a predetermined angle. Belleville washers 85 and nuts 87 secure the cable end and maintain tension on the cables during cooling of the cables. Alternatively, a counterbored hole can be provided in the housing at an appropriate angle and the cable secured directly against the housing. An airtight cover 91 is welded in place over each pair of tensioners after magnet assembly so that the housing 15 remains airtight.

Referring now to FIG. 6 the axial coil form suspension is shown. To prevent axial motion of the coil form relative to the housing, four cables 93, 94, 95 and 96 each having one end formed in a loop have their looped ends encircling a respective one of four trunnions 97. The trunnions are located directly opposite one another with two trunnions on either side of the coil form. The trunnions on each side are symmetrically spaced axially about the axial midplane of the coil form and secured to the form. The trunnions are located close to the axial midplane to limit movement of the trunnions relative to the housing when the magnet is cooled and the coil form contracts. The cable looped about each trunnion extends axially away towards the closest end of the vacuum housing 15. To simplify adjustment during assembly, one or both ends of the cable turn radially outward about a pulley 101 mounted to the housing rather than extend through the housing ends. The cable extends radially through an aperture in the housing to securing means. The securing means comprises a tensioning bolt 103 about which the cable is wrapped and a "U-shaped" bracket 105 supporting the bolt from the housing. A nut and lock nut 107 are located on the tensioning bolt to prevent the bolt from turning relative to the bracket.

Referring now to FIGS. 5, 7 and 8, the shield 65 support is shown. Shield 65 is supported from the coil form by nine spacers affixed to the coil form and extending radially from the form. Six spacers 111 are arranged in two groups of three equally circumferentially spaced radially outwardly extending spacers.

The spacers 111 each comprise a thin wall G-10 cylinders with a disc shaped plug 113 on one end and a plug 114 having exposed threads on the other. The plugs which also can be fabricated from G-10 provide rigidity. Spacers 111 are situated in holes extending through the coil form 25 in heat conductive sleeves 115. The sleeves have a flanged end which is secured to the copper shell 57 of the coil form. The other end of the sleeve extends radially inward and has an inner threaded aperture to receive the threaded end of plug 114. The threaded disc shaped plug 114 has a slot 116 which extends to the spacer interior which serves to vent the spacer during evacuation of the magnet and to provide a screw driver slot to adjust the spacer radially outwardly from the form so that the end of the spacer having plug 113 extends beyond the coil form. Spacers 111 keep the radiation shield 65 surrounding the coil form spaced away and not directly touching any portion of the form or shell 57.

Referring now to FIGS. 5, 7 and 9, three spacers 117 extending from the interior of the coil form circumferentially spaced along the coil forms axial midplane 118, keep the portion of the radiation shield 65 situated in the interior of the coil form spaced away. Spacers 117 comprise a thin wall G-10 cylinder with a disc shaped plug 119 inserted at one end and a ring of insulating material 120 surrounding the other end. The ring 120 has threads on its outside diameter. The spacers 117 are located in apertures in the coil form. The shell end of apertures are threaded. The spacers 117 are threaded in place protruding radially inwardly from the coil form.

In addition to the nine radial spacers, four spacers 121, two on each axial end of the coil form are positioned in apertures to keep the ends of the shield from contacting the coil form. All the spacers 111, 117 and 121 by being situated in apertures and not contacting the coil form except at an end which is situated in the aperture, have a length greater than the distance between the coil form and the adjacent shield making the effective thermal path of the spacer greater than the distance between the coil form and the shield.

During assembly the vacuum pressure impregnated fiberglass coil form is placed inside the vacuum housing which has both ends removed. The four cables of the axial suspension system are looped around the trunnions. The radiation shield which comprises an inner and outer cylinder and two end rings has the outer cylinder slipped over the coil form which for assembly convenience can be standing on end inside the housing which is also on one end. Spacers 111 which are initially retracted almost flush with the coil form exterior are extended outwards using adjustment slots accessible from the interior of the coil form to adjust the spacing between the coil form and the outer cylinder of the radiation shield. Spacers 117 protrude a fixed distance radially inwards from the coil form are not adjustable after initial installation. Spacers 121 protrude from the ends of the coil form a fixed distance. Spacers 117 and 121 normally do not contact the shields but rather are a short distance away to ease assembly and reduce thermal conduction paths. If the magnet is jarred, such as during shipping, spacers 117 and 121 prevent contact between the shield and coil form. Typically peak shipping acceleration above gravity is 1 g in all directions. Since the magnet will be shipped with the coils superconducting, direct contact between shield and coil form should be avoided. With the axial suspension cables extending through the shield the shield end rings are bolted in place. Once the cable suspension are put in place and properly tensioned the ends of the shield can be bolted or welded in place.

Even though spacers 117 and 121 act as bumpers to limit shield deflection spacers 111, 117 and 121 all must be designed for minimum heat leak in case of plastic deformation of the shield or out of roundness of the shield.

In a situation where the gap between magnet and shield is $\frac{3}{8}''$ and the coil form has a thickness of 1" the thermal path length can be increased by a factor of 3.7. While the thermal conduction length increases, the supports must be designed with possible buckling of the supports under their compressive load in mind. For the simplest straight tubular column design, a conservative estimate of the critical buckling load of a fiberglass epoxy cylinder 1 inch long with both ends clamped by disk shaped inserts may be given by using the free end model, which gives $$Pcr = (7.5 \times 10^6) t^2 \qquad (1)$$

Where Pcr is the critical load in pounds and t the radial thickness in inches. For a shield mass of 300 pounds, and for a 2 g total dynamic load carried by the minimum of 2 vertical supports, Pcr must be 300 pounds. Therefore the minimum tube thickness 0.0063". An adequate safety factor may be provided by a 0.010" thickness tube.

The heat leak down a 0.01" thickness by $\frac{3}{8}$ inch diameter tube from 50K, the nominal shield operating temperature, to 10K is 6 mW. The 11 supports thus represent a total heat load of 0.066 W, which corresponds to a negligible increase in magnet operating temperature of 0.03 K. This heat leak must be carried to the cooler by the copper shell surrounding the coil form, so the outward radial supports are attached to a copper sleeve which carries their heat leak to the shell. The inner radial supports are threaded into the outer diameter of the coil form, so their heat will pass directly into the shell. The axial supports are threaded into the metallic end rings on the coil form, so their heat is also carried directly to the copper shell.

As shown in FIG. 1, a cryocooler 123 is positioned in a low field region in the midplane of the cylindrical assembly in a vertical service stack 125 which penetrates the outer vacuum vessel 15 and the thermal radiation shield 65. The second and first heat stations are in intimate contact with shell 57 and shield 65, to maintain the temperature below 10° K. and 50° K., respectively, by direct thermal conduction cooling. The bus bars are heat stationed to the second heat station. Permanently connected leads extend down the service stack and are heat stationed at both heat stations and electrically connected to the bus bars 61 and 63. A cryocooler cold head interface receptacle such as the one shown in copending application, Ser. No. 215,114 can be used in the embodiment of FIG. 1 and is hereby incorporated by reference.

Cryostat vacuum envelope 15 is shown designed as a passive magnetic shield to contain the fringe 5 Gauss field of a 0.5T magnet within a cylindrical surface of 3 m radius and 8 m length as typically required to install the magnet in a standard hospital room with a 12 foot high ceiling.

In one embodiment of a 0.5T magnet, the coils in FIG. 1 are wound with a bare $Nb_3Sn$ wire having a 0.018 inch diameter and an insulated copper wire also having a diameter of 0.018 inch. The interlayer glass cloth insulation is 0.004 inch and the current flowing in the conductors is 58 amperes.

With the shielded vacuum vessel the 5 gauss line is 2.9 m. in the radial direction measured from the center of the bore and 4.0 m. measured axially from the center of the bore. The inhomogeneity on the surface of 50 cm. diameter spherical volume centered in the bore is 65 ppm. and 15 ppm. on a 40 cm. diameter spherical volume centered in the bore.

Referring now to FIG. 10, superconductive magnet 131 with individually wound coils is shown. Three coil pairs 135 and 136, 137, 138, and 139 and 140 are co-wound with bare $Nb_3Sn$ wire and a strand of stabilizer which comprises insulated copper wire in the embodiment of FIG. 10. The $Nb_3Sn$ and copper wire are electrically connected at least at the beginning and end of each coil. The individually constructed coil windings with layers of insulation such as fiberglass cloth between layers are vacuum epoxy impregnated and all of the coils are made to have the same outside diameter by adjusting the fiberglass overwrap thickness on the outside of each superconductor coil. A closed loop of copper foil is used every few layers, every third or fourth, for example, to provide quench protection as described previously. The coils are assembled with cylindrical shell fiberglass spacers 143 to form a cylindrical subassembly with the coil pairs symmetrically situated in the axial direction about the midpoint of the cylindrical shell. The coil to coil lead connections are made in axially extending grooves (not shown) on the outside of the spacers using copper bus bars, for example. The cylindrical subassembly is machined to obtain a smooth cylindrical outside surface. The subassembly is adhesively bonded inside a high thermal conductivity thermal shell 145 fabricated from high thermal conductivity copper or aluminum which encloses the sides and inner diameter of the winding. Leads 147 and 149 extend from the windings at nearly the same circumferential location. The leads are electrically insulated from the high thermal conductivity shell. The coil subassembly, enclosed by the high thermal conductivity shell, is positioned in a thermal radiation shield 151 which is spaced away from the coil subassembly.

Figure 11:
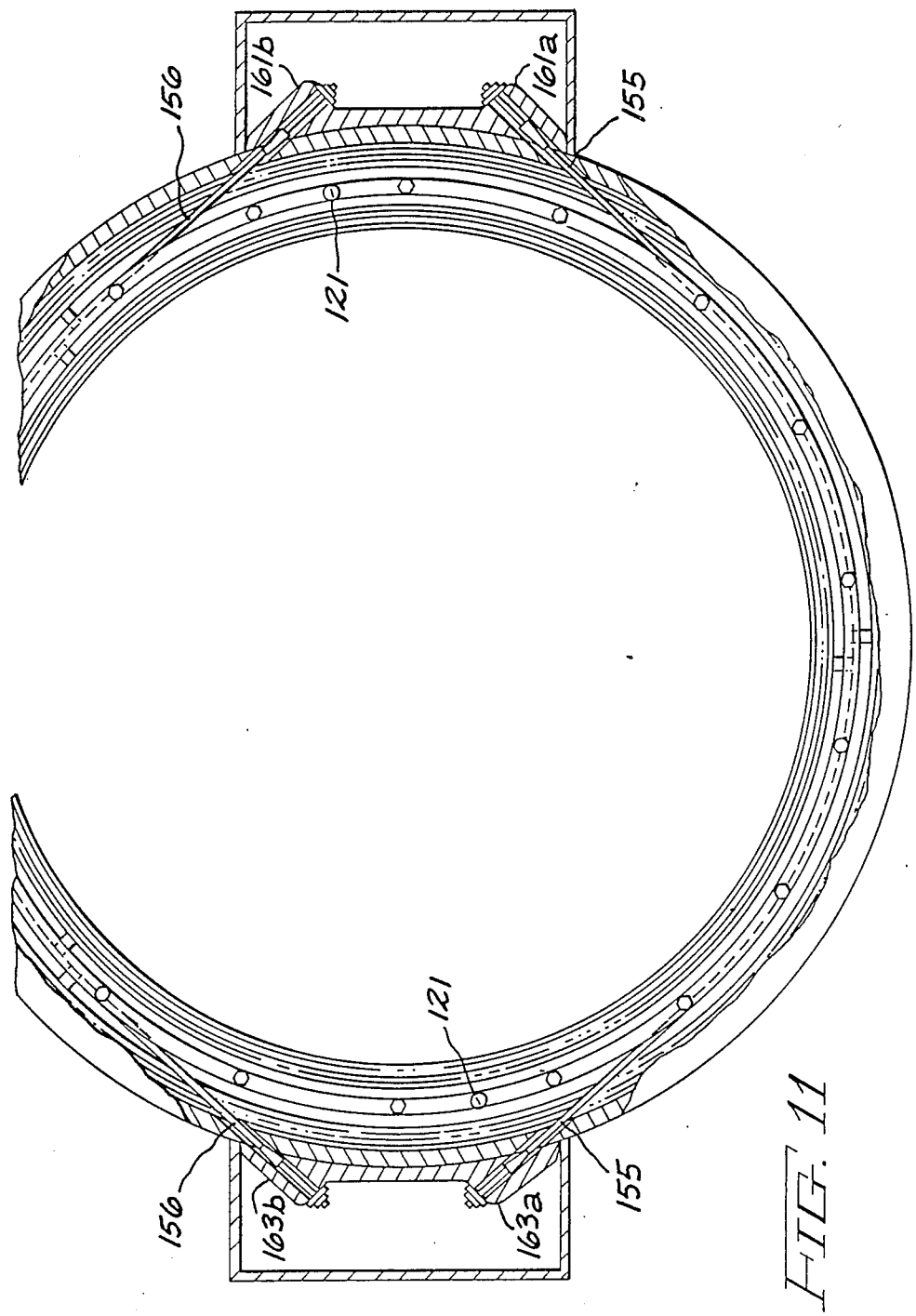
FIG. 11 is a partial end view partly in section of the magnet of FIG. 10.

Referring now to FIG. 11 the coils in the thermal shell are suspended in a vacuum housing by a radial and axial cable suspension similar to the suspension used to support the coil form in FIG. 1. Stainless rings 153 with a single circumferential groove in the outside surface are bolted to the copper shell 145. Four cables 155 156, 157 and 158 and eight cable tensioners 161a and b, 163a and b, 165a and b, 167a and b are again used. The cable tensioners are positioned as previously described, however, the cables are connected differently. There are still two cables used at each end but each cable is connected between one of each of the pairs of cable tensioners that are closest circumferentially. Each cable extends less than halfway around the ring in the circumferential groove. The axial support is the same as previously described. The shield 151 is supported from the coil assembly at discrete locations as previously discussed.

A two stage Gifford McMahon cryocooler 123 is positioned in a low field region in the midplane of the cylindrical assembly in a vertical service stack 125 which penetrates the outer vacuum vessel 171 and the thermal radiation shield 151. The second stage of the cryocooler which operates at approximately 9K is in intimate contact with the high thermal conductivity shell. The first stage of the cooler which operates at about 50° K. is in intimate contact with the thermal radiation shield 151.

Figure 12:
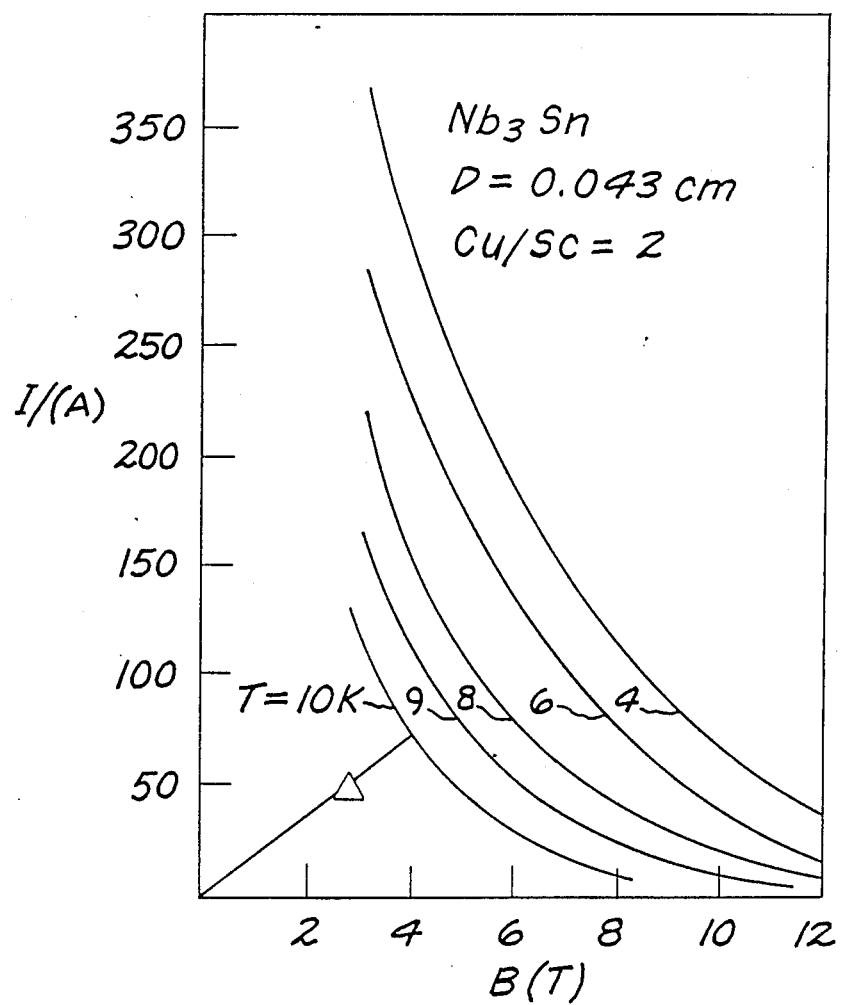
FIG. 12 is a graph showing a magnet load line as a function of current and field strength at different operating temperatures.

In one embodiment of the magnet shown in FIG. 11 with a 1.5 T field in the magnet bore, the current through the magnet windings is 50 amperes. The superconductive coils comprise a bare $Nb_3Sn$ wire with a diameter of 0.043 cm. cowound with an insulated copper wire also having a diameter of 0.043 cm. The bare $Nb_3Sn$ wire has a single core with 1500 filaments 5 microns in diameter. The copper to matrix ratio is 1.5. The wire can be obtained, for example, from Intermagnetics General Corp., Guilderland, N.Y. The interlayer insulation has a thickness of 0.010 cm. The magnet load line is shown in FIG. 12 for a $Nb_3Sn$ wire diameter of 0.043 cm. The expected inhomogeneity is 29 ppm at the surface of a 50 cm. diameter spherical volume centered in the bore of the magnet and 4 ppm at the surface of a 40 cm. diameter spherical volume centered in the bore of the magnet.

Figure 13:
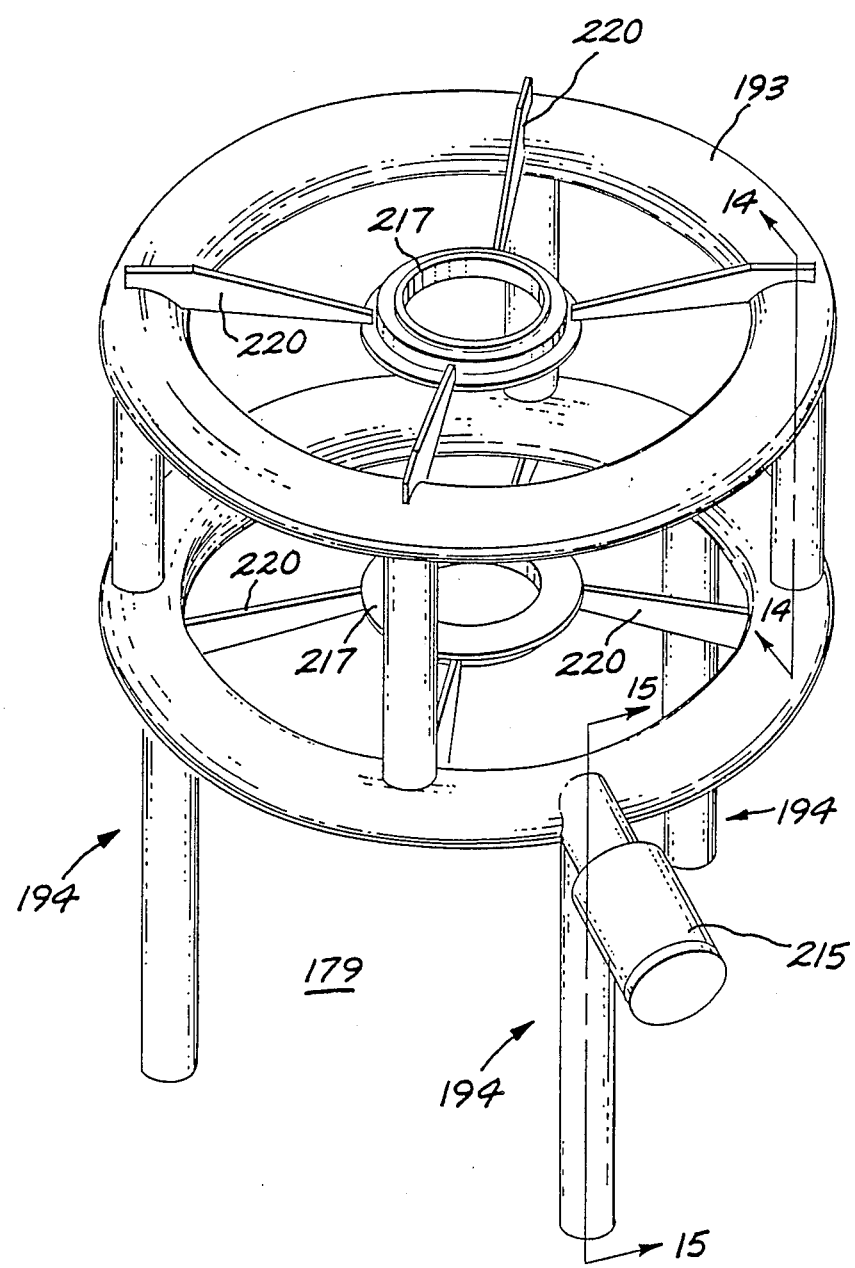
FIG. 13 is an isometric view of an open hybrid magnet having resistive and superconductive coils.
Figure 14:
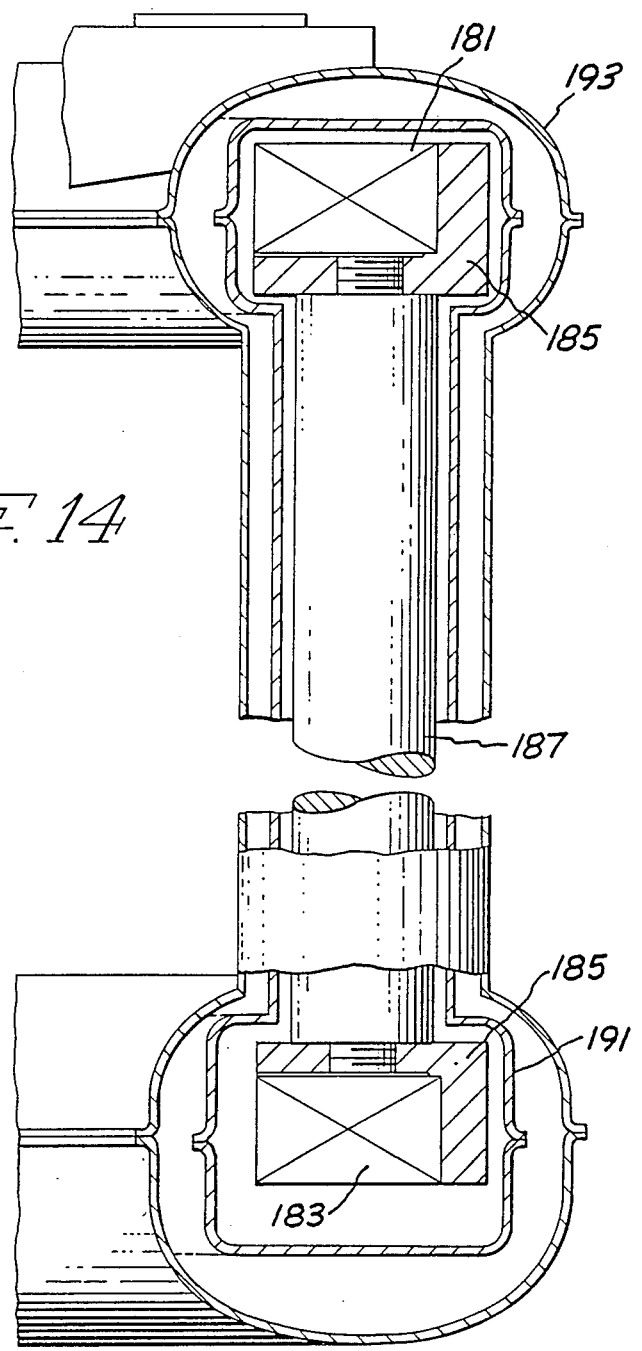
FIG. 14 is a sectional view along the lines 14—14 of FIG. 13.
Figure 15:
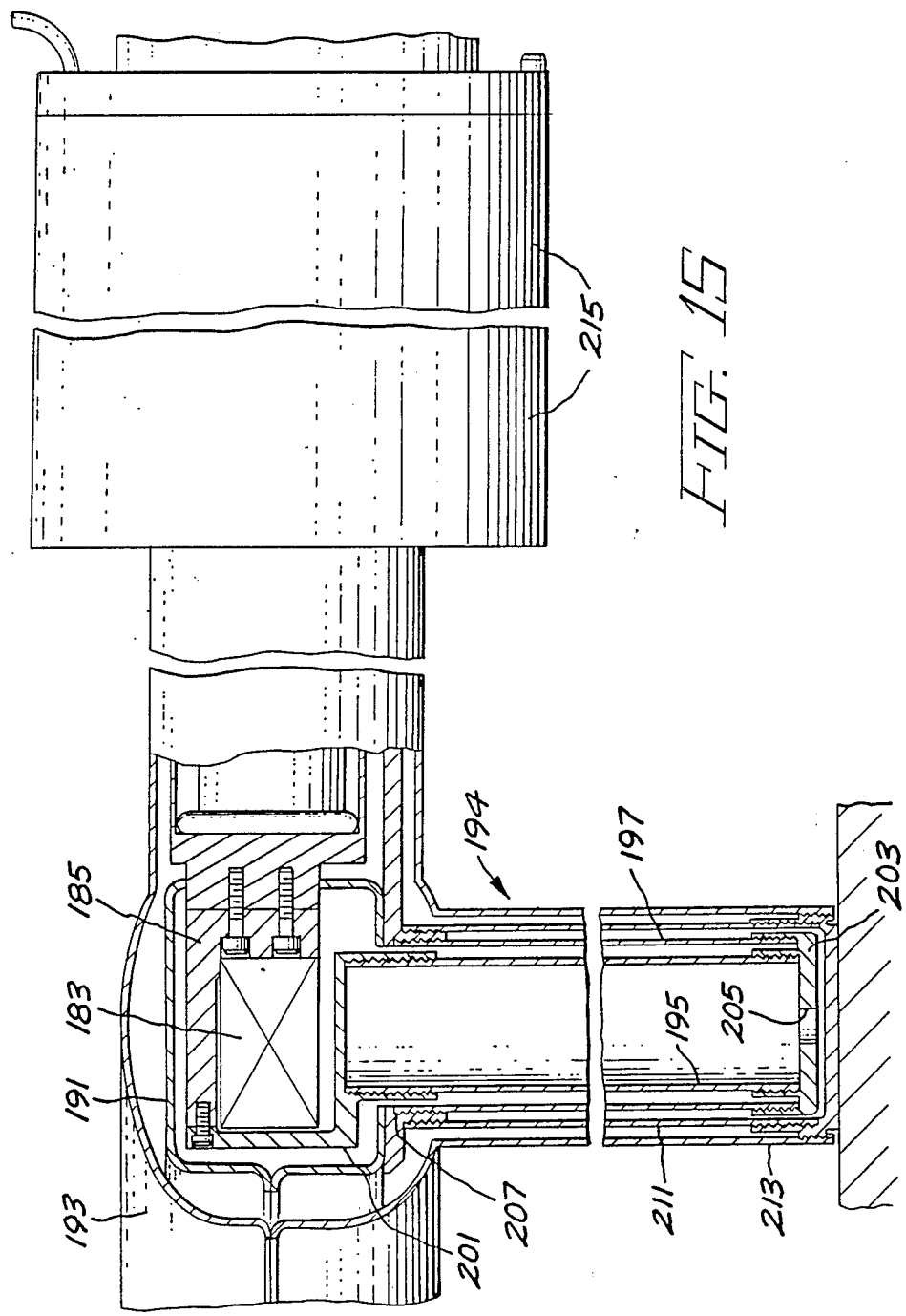
FIG. 15 is a sectional view along the lines 15—15 of FIG. 13.
Figure 16:
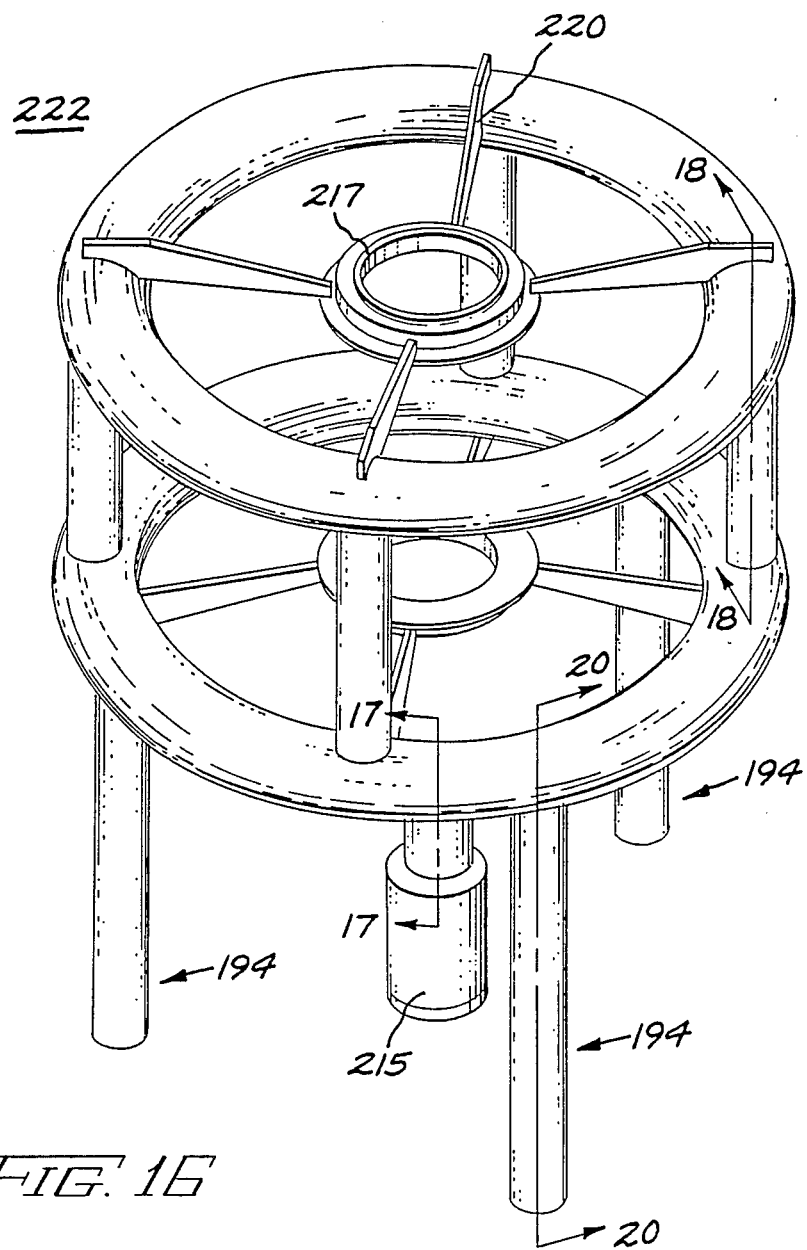
FIG. 16 is an isometric view of another embodiment of a hybrid magnet.

A hybrid superconductive/resistive magnet 179 suitable for use in a magnetic resonance imaging system is shown in FIGS. 13, 14 and 15. Two epoxy-impregnated superconducting coils 181 and 183 are each supported by aluminum rings 185 which are shrunk fit on the outside surface of the epoxy-impregnated coils. The two coils are spaced apart from one another and lie in parallel planes with their centers being on a line extending perpendicularly to the planes. The aluminum rings 185 in addition to surrounding the outside surface of the coils cover the surfaces of the coils which face one another. The coils are spaced apart by four solid aluminum posts 187 which are secured between portions of the aluminum rings covering the facing surfaces of the coils. The coils and posts are surrounded by a thermal shield 191 which surrounds each of the posts and coils individually. The coils and thermal shield are supported inside a vacuum enclosure 193 by three suspension posts 194. Each suspension post comprises two concentric G-10 thin wall tubes 195 and 197 to support the windings. The exterior of the tubes can be covered with aluminized mylar to reduce emissivity. One end of inner tube 195 is in contact with an aluminum bracket 201 affixed to the aluminum ring 185. The other end of the inner tube is supported in an aluminum cup 203 having a central aperture 205. The cup is also affixed to one end of the second concentric tube 197. The other end of the second concentric tube is suspended from a ring 207 which is supported by a third concentric tube 211 which surrounds the two concentric tubes 195 and 197. The third concentric tube 211 in addition to supporting the second concentric tube 197 also supports the thermal shield 191. The other end of the third concentric tube is affixed by a ring 213 to the vacuum housing 193 which also individually surrounds the three concentric tube supports. The inner and third tubes 195 and 211, respectively, in the supports are in compression while the second tube 197 is in tension. The suspension posts are sufficiently flexible to accommodate the radial thermal contraction of the shield and windings relative to the vacuum enclosure during cool down.

The vacuum enclosure housing 193 and radiation shield 191 are each fabricated as transversely split toroids. The radiation shields can have their exterior silver coated to reduce their thermal emissivity. The halves of the radiation shield can be joined together by soldering or by thermally conductive epoxy. The stainless steel housing has welded seams joining the halves to create an airtight enclosure.

The windings are cooled by a two-stage cryocooler 215 which is situated in an extension of the vacuum envelope. The first stage of the cryocooler is thermally connected to the thermal shield 191 to maintain the thermal shield at 50K and the second stage is in thermal contact with the aluminum ring 185 of the winding to maintain the winding below 10K. Low thermal resistance is established between the cryocooler temperature stations and those of the shield and windings, by high pressure contact through soft indium gaskets.

Inboard resistive coils 217 are situated approximately in the same plane and concentric with each of the superconductive coils, respectively. The inboard resistive coils carry sufficient low ampere-turns so that they can be wound with hollow water cooled copper conductors to operate at a current density of 500 $A/cm^2$. The resistive coils are each supported from the vacuum envelope by four radially extending brackets 220. The resistive coils and superconductive coils are all connected in series and each carries current in the same circumferential direction. Current is provided to the superconductive coil by permanently connected heat stationed leads.

A 0.5 T embodiment of the hybrid superconductive/resistive magnet would have the following characteristics. A spherical imaging volume of 20 cm. with a peak-to-peak inhomogeneity of 30 ppm. A patient access opening of 40 ×70 cm. The superconducting and resistive coils would each carry 50 amperes, with 6074 and 135 turns respectively, and a coil current density of 11,400 and 500 amperes/cm$^2$, respectively. The superconductive coils each would have a radius of 59.4 cm. and the resistive coils would have a radius of 15.2 cm. The superconductive coils are spaced apart axially by 51.4 while the resistive coils are spaced apart by 52.2 cm. The cross section in height by width of the superconductive and resistive coils are 3.8 ×7 cm. and 3.7 ×3.7 cm., respectively. The magnet has an inductance of 206 H and stored energy of 258 kilojoules. The superconductor wire is Nb$_3$Sn wire and copper wire co-wound. The bare Nb$_3$Sn wire and insulated copper wire each have a diameter of 0.043 cm. with a copper to superconductor ratio of 1.5. The superconductor wire is superconducting at 10° K.

Referring now to FIGS. 16, 17, 18 and 19 another embodiment of a hybrid superconductive/resistive magnet is shown. The magnet 222 has generally the same configuration as the magnet of FIG. 13. Two superconducting coils 221 and 223 are provided wrapped around a copper coil form 225 having a "U" shaped cross-section. The coil form comprises three pieces, a band 227 formed by rolling and welding the ends of a copper strip and two circular flange pieces 229 having a central aperture which are joined at their inner diameter on either side of the band 227, such as by soldering. The superconductor wire can comprise a 0.017 ×0.025" Nb$_3$Sn superconductor with a copper to superconductor ratio of 0.5. The wire is covered by a 0.0025" glass braid. The wire is processed by the bronze method and is available from Oxford Airco.

Figure 17:
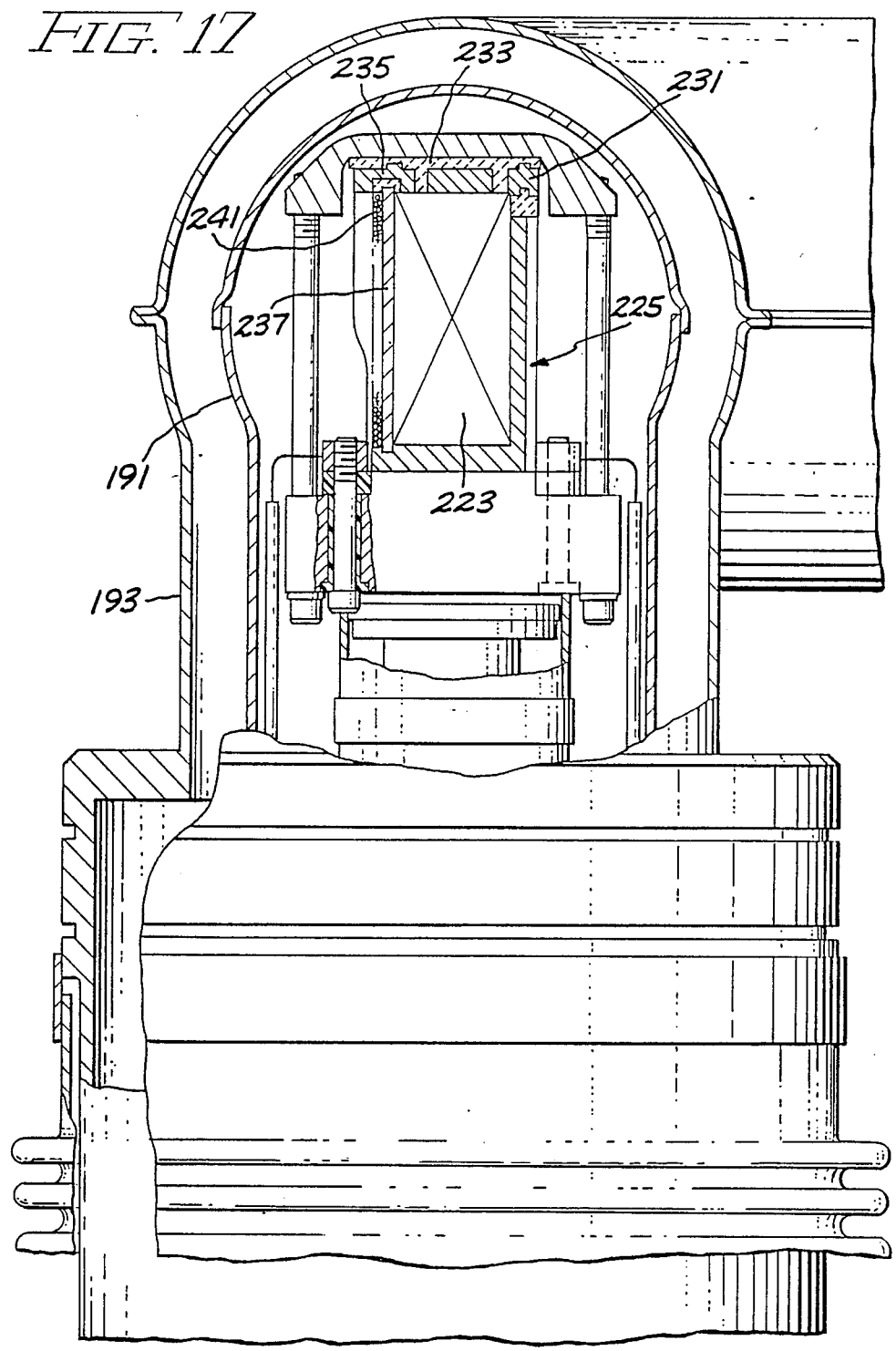
FIG. 17 is a sectional view along the lines 17—17 of FIG. 16.
Figure 19:
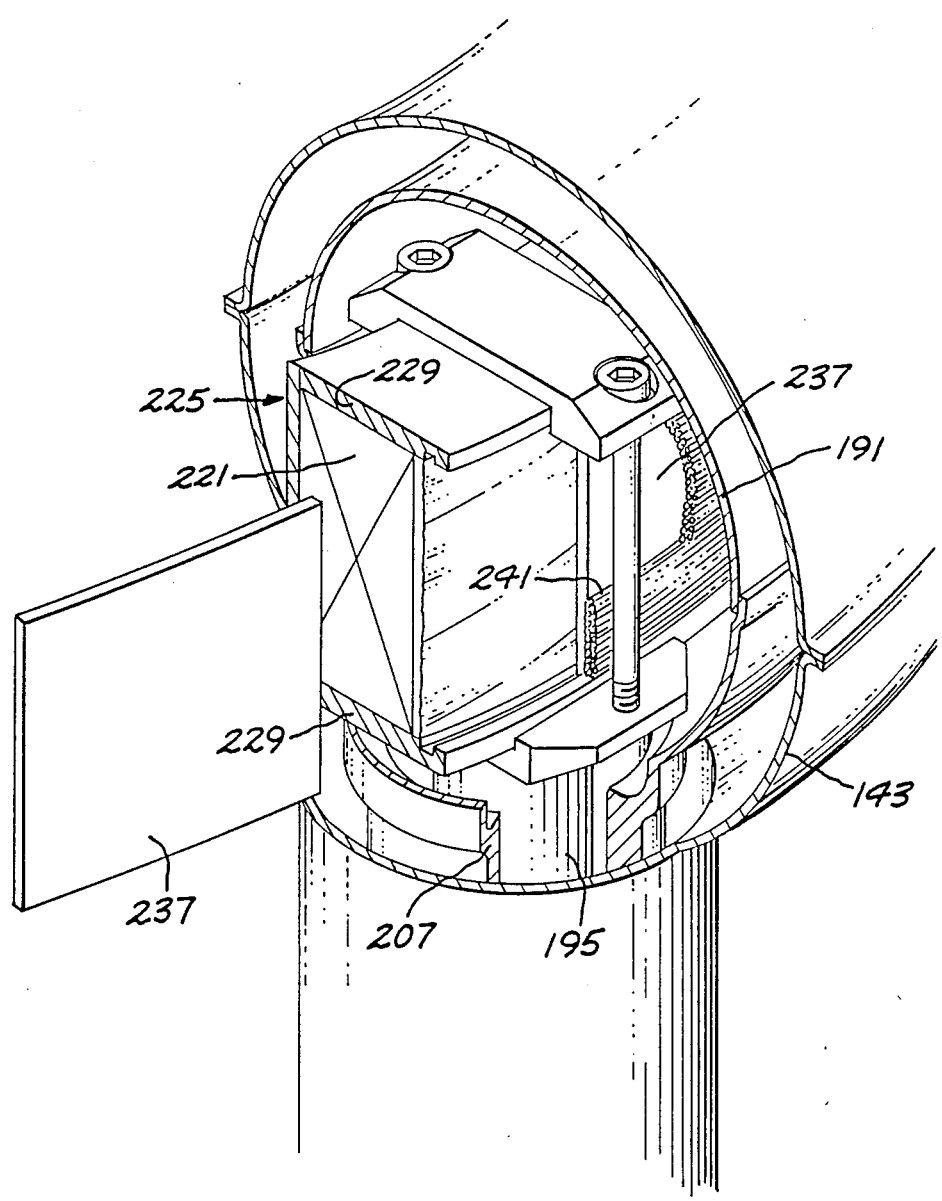
FIG. 19 is a part sectional part exploded isometric view showing how the superconductive coils are wound in the magnet of FIG. 16.
Figure 20:
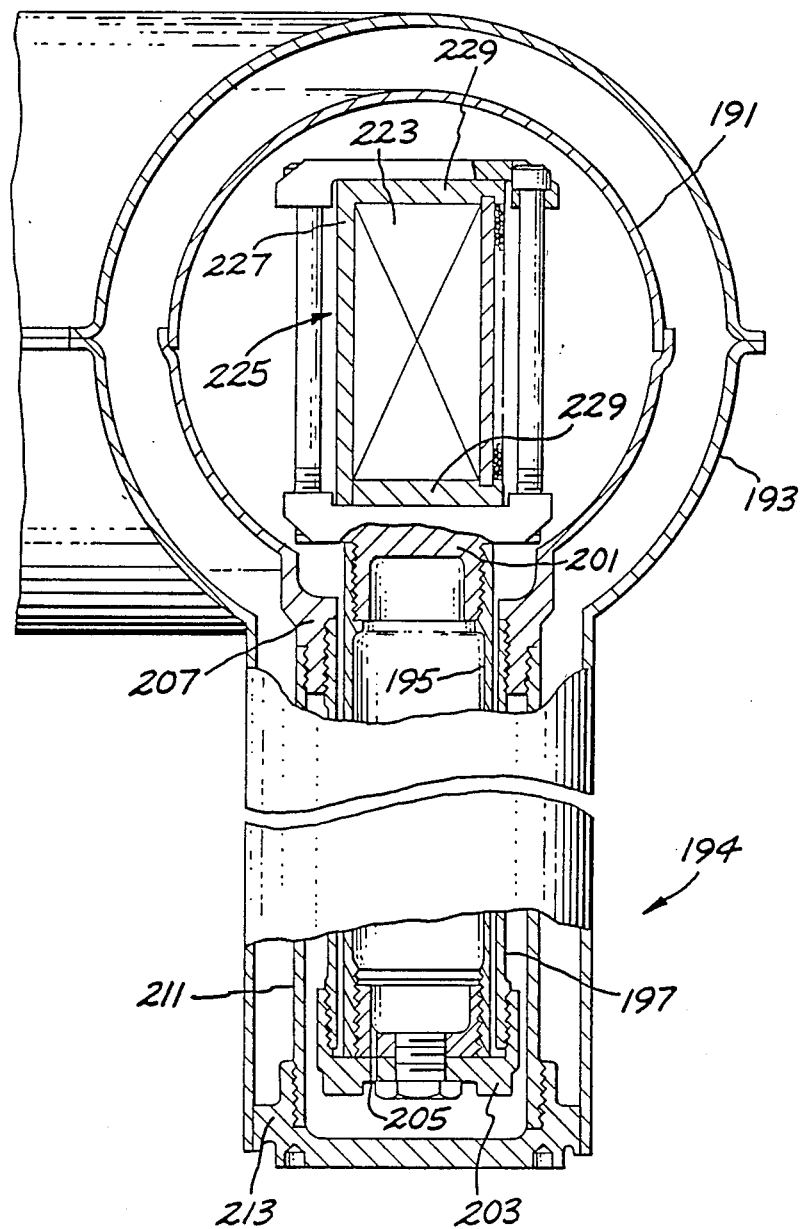
FIG. 20 is a sectional isometric view of a compact open superconducting magnet.

The interior of the form is treated to improve bonding to epoxy and lined with fiberglass cloth. Referring particularly to FIG. 17, the wire is soldered to a starting terminal 231 in the flange 229 which is insulated from the rest of the flange by insulating block 233. The wire is wrapped with a tension of 3-5 ounces. Each layer is separated by fiberglass cloth insulation. Every fourth or fifth layer is surrounded by a thin copper foil band approximately 0.010 inch thick. The band surrounds the layer of wire in the coil form with the ends overlapping and soldered. The band allows the winding to pass through to the next layer as previously described. The winding terminates at finishing terminal 235 to which it is soldered. If splices are necessary, a 30" overlap of wire with the insulation removed can be soldered together with the resulting joint not being superconductive but having a very low resistance. The winding is covered with fiberglass cloth and copper plates 237 are slid into slots formed in the flange pieces. The slots extend to the periphery of the ring in one location to allow a plurality of copper plates to slide in and be positioned circumferentially about the perimeter of the winding. With the plates completely surrounding the winding an uninsulated stainless steel overwrapping 241 encloses the copper plates. The overwrapping is covered with release material and covered with brass shims (not shown) held in place by wire (not shown) and both coils 221 and 223 are vacuum epoxy impregnated. The wire and brass shims are removed together with any excess epoxy. After impregnation the plates are rigidly positioned in their slots. The copper plates transmit part of the radially outward load created by the windings during magnet operation to the "U" shaped coil form.

The coils are surrounded by a 50K radiation shield 191 which in turn is surrounded by a vacuum enclosure housing 193. Both the shield and housing are fabricated as previously described, and supported in the cryostat by three supports 194 each having three concentric tubes 195, 197 and 211 also of the type previously described. Four aluminum posts 187 support coil 221 above coil 223. Clamping brackets 243 hold the coil form 225 and coils and are secured to supports and posts. The resistive coils are supported as previously described by brackets. Leads are permanently attached to the cryocooler connecting the two superconducting coils in series. The incoming leads are heat stationed to the two stages of the cryocooler. Leads from the second stage heat station are coupled to the input terminal of winding 223 and the output terminal of winding 221. The output and input terminal of windings 223 and 221, respectively, are coupled together. The resistance coils are also connected in series with each other and the superconductor coils. All the currents in all the coils flow in the same circumferential direction.

Figure 21:
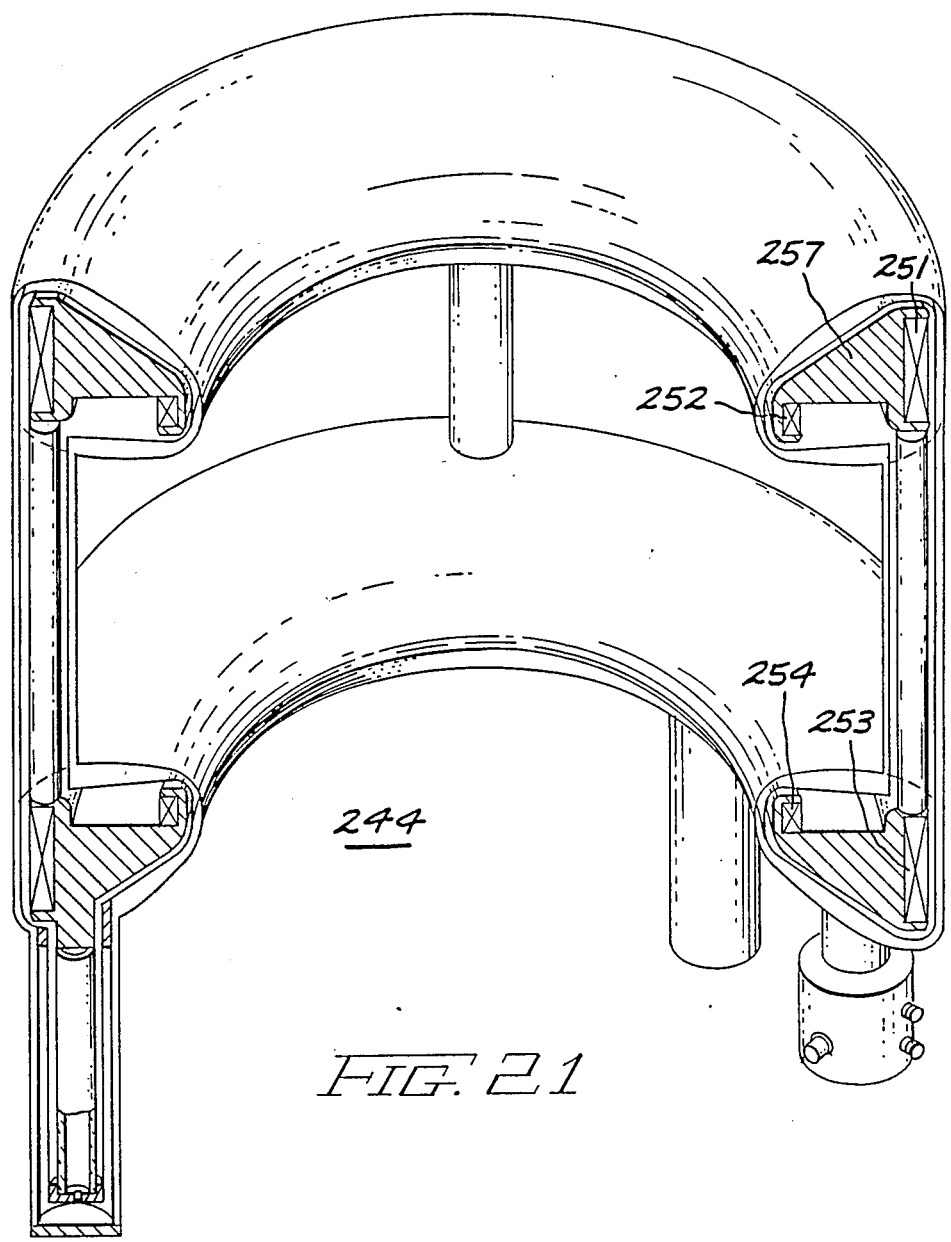
FIG. 21 is a sectional isometric view of a compact open superconducting magnet.

Another embodiment of an open magnet configuration is shown in FIG. 21. The magnet 244 has no resistive coils but rather has four superconducting resin impregnated coils, 251, 252, 253 and 254, two superconducting coils 251 and 252, and 253 and 254 in each of the two toroidal sections of the cryostat. Coil 251 and 253 have the same diameter and number of turns both of which are greater than those of coils 252 and 254 which both have the same diameter and number of turns. The superconductor coils in each of the toroidal sections is wound on a copper form 257. The coil forms are spaced apart parallel to one another with their centers lying on the same line which is perpendicular to the plane in which each of the coils lie. The coil forms are separated by aluminum posts as previously described with both coil forms supported by supports 194 each having three concentric tubes. A radiation shield surrounds the coil forms and is in turn surrounded by a vacuum enclosure. During operation, all the coils are connected in series with the coils 251 and 253 each carry current in the same direction while coils 252 and 254 carry current in the opposite circumferential direction.

In the magnet of FIG. 21, the coils 251, 252, 253 and 254 can be wound on a fiberglass form having the shape of the metal coil form 257. A conductive shell can surround the lower portion and sides of the coil form supporting coils 253 and 254. The generally U-shaped shell fabricated of copper, for example, could be used as a pan in which the coils could be vacuum pressure impregnated.

In a 0.5T embodiment of FIG. 21, the outer coils are spaced 65 cm. from one another and have a radius of 56.1 cm. The outer coils carry 50 amperes in a Nb$_3$,Sn wire having a diameter of 0.043 cm. which is cowound with an insulated copper wire having a diameter of 0.043 cm. The coils have a cross section 2.6 cm. high by 14 cm. in width. Superconductive coils 252 and 254 are spaced 51.8 cm. apart and have a radius of 40 cm. The coils 252 and 254 are cowound with the same dimension copper and Nb$_3$Sn wire and carry 50 amperes. Coils 252 and 254 each have a cross section of 2 cm. high by 3.4 cm. wide. The magnet has a clear bore diameter of 70 cm. with a transverse patient access of 40 ×70 cm. The calculated homogeneity in a 25 cm. sphere is 13 ppm.

Figure 22:
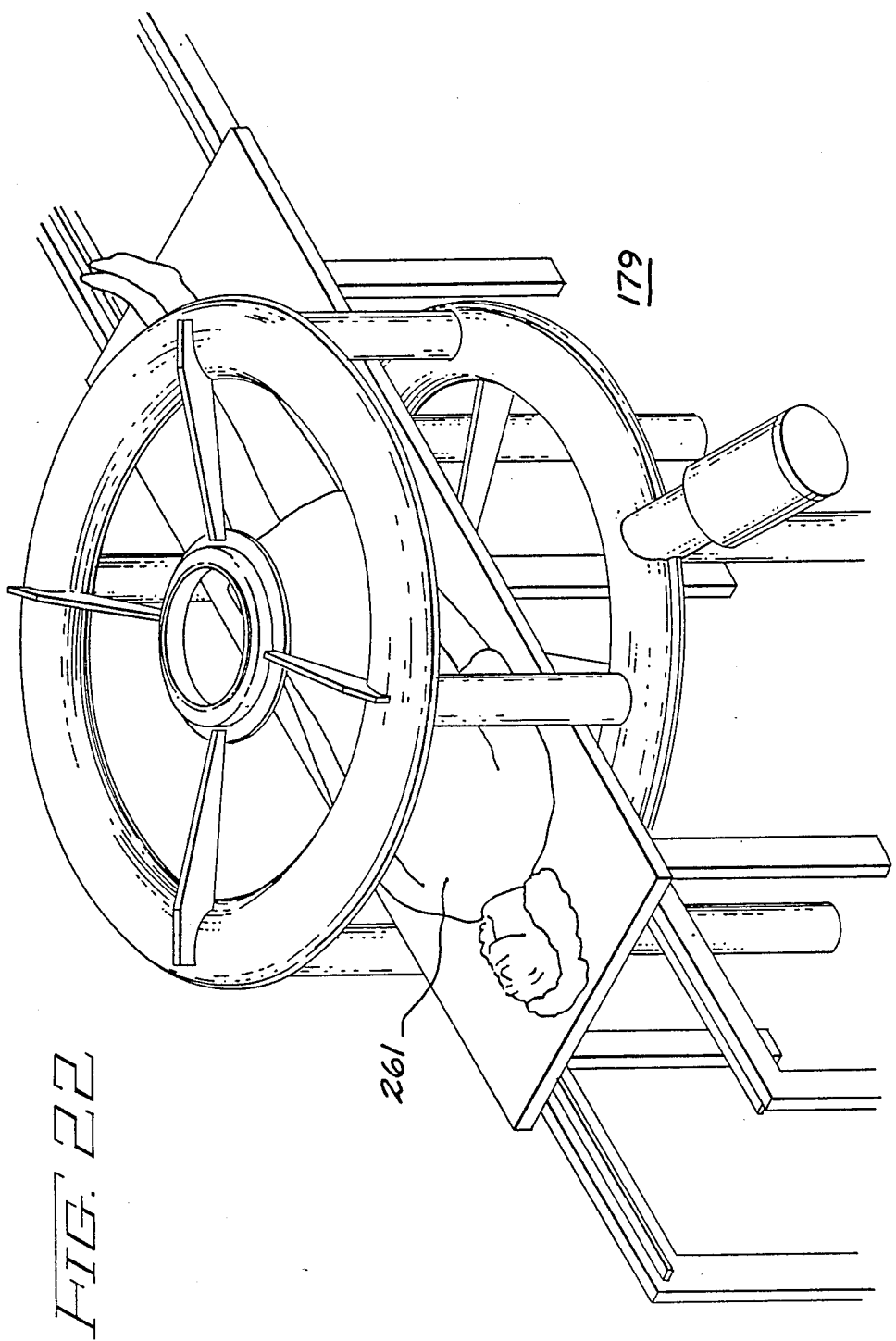
FIG. 22 is an isometric view of an open hybrid magnet with a patient situated in the magnet bore.
Figure 23:
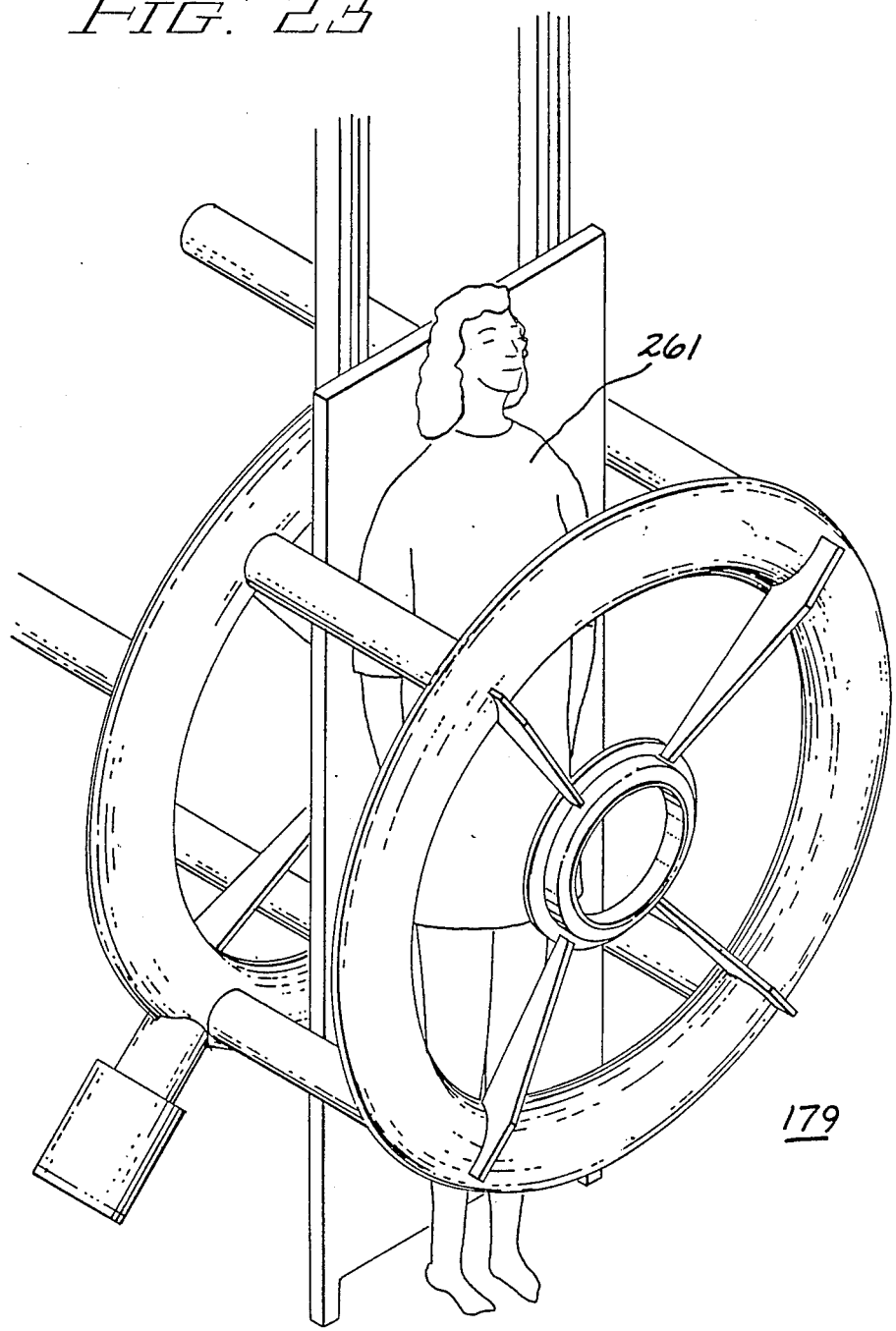
FIG. 23 is an isometric view of an open hybrid magnet which is movable in the vertical direction and accommodates patients in a standing position.

As shown in FIGS. 22 and 23, the configuration of the open magnet 179 provides a greater patient field of view than magnets having a series of coils on a closed cylindrical coil form. The open magnets can be arranged with a patient 261 to be imaged standing or lying down. In the configuration of FIG. 23, the patient can remain stationary while the magnet moves in the vertical direction as needed.

Figure 24:
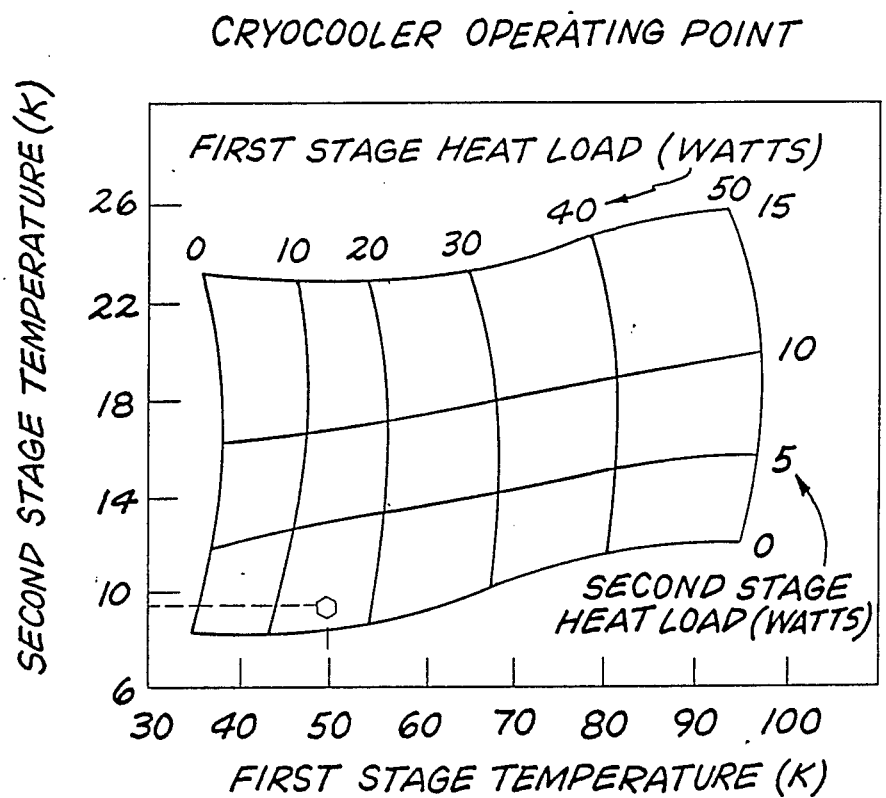
FIG. 24 is a graph showing the first and section stage temperature of a cryocooler as a function of the heat loads imposed on the cryocooler.

A typical refrigeration capacity of a Model 1020 Cryodyne® cryocooler from CTI-Cryogenics, Waltham, Mass., operating from 60 Hz. power supply is shown in FIG. 24, which also shows the operating point of the cryocooler when used with the different embodiments superconductive magnets. The magnet cooling load is approximately as follows:

| $Nb_3Sn$ Winding | |
|---|---|
| Radiation | 0.110 |
| Conduction | 0.090 |
| Current leads, cooper | 0.600 |
| Cryocooler Second Stage Heat Load | 0.800 Watts |
| Radiation Shield | |
| Radiation | 8.6 |
| Conduction | 2.0 |
| Current leads, copper | 4.8 |
| Cryocooler First Stage Heat Load | 15.4 Watts |

During start up the cryocooler is operating and a power supply ramps up gradually to a constant 50 amperes of current through the current leads. During ramp up, currents will be induced in the conductive loops in the layers of the coil. The currents, however, will not create a problem since the change of current is gradual. Once superconducting operation is achieved the power supply can remain connected, although the coils are superconducting the copper bars connecting coils have resistive losses as well as the current leads. The losses, however, are not very great and the large inductance and small resistance of the magnet provides for a large time constant.

During operation all heat carried to the magnet surface by radiation and conduction must be removed by the cryocooler so that the superconducting wire temperature does not increase above the transition temperature and cause a quench.

In case of a quench the conductive foil loops would begin to carry current induced in the loops due to the decreasing magnetic field. The loops would heat and spread the quench quickly to other coils. If the quench does not spread to the other coils quickly all the stored energy of the magnet would have to be dissipated at the original quench site, overheating and destroying the wire.

The cowound stabilizer if soldered to the superconductor every layer provides a low resistance in parallel with the portion of the superconductor wire undergoing the quench reducing the current carried by the quenched superconductor.

Current leads for the superconductive magnets in the embodiments of the present invention, cannot be helium vapor cooled to reduce conduction heat transfer to the superconducting magnet and to dissipate the resistance heating of the leads since consumable cryogens are not used. The current leads used are heat stationed to the first and second stage of the cryocooler to intercept heat before it reaches the superconducting coils.

In the cryocoolers used in the present invention resistive metallic conductors, such as copper, are used in the lead section from the exterior of the cryostat, which is at an ambient temperature of 300° K., to the first stage of the cryocooler which has a temperature of 50° K. during operation. A resistive metallic conductor is also used in the lead section from the first stage of the cryocooler which is at 50° K. to the second stage which is at 10° K. To minimize the conduction heat transfer to the heat stations by the current leads the lead aspect ratio must be optimized for a given current.

Figure 25:
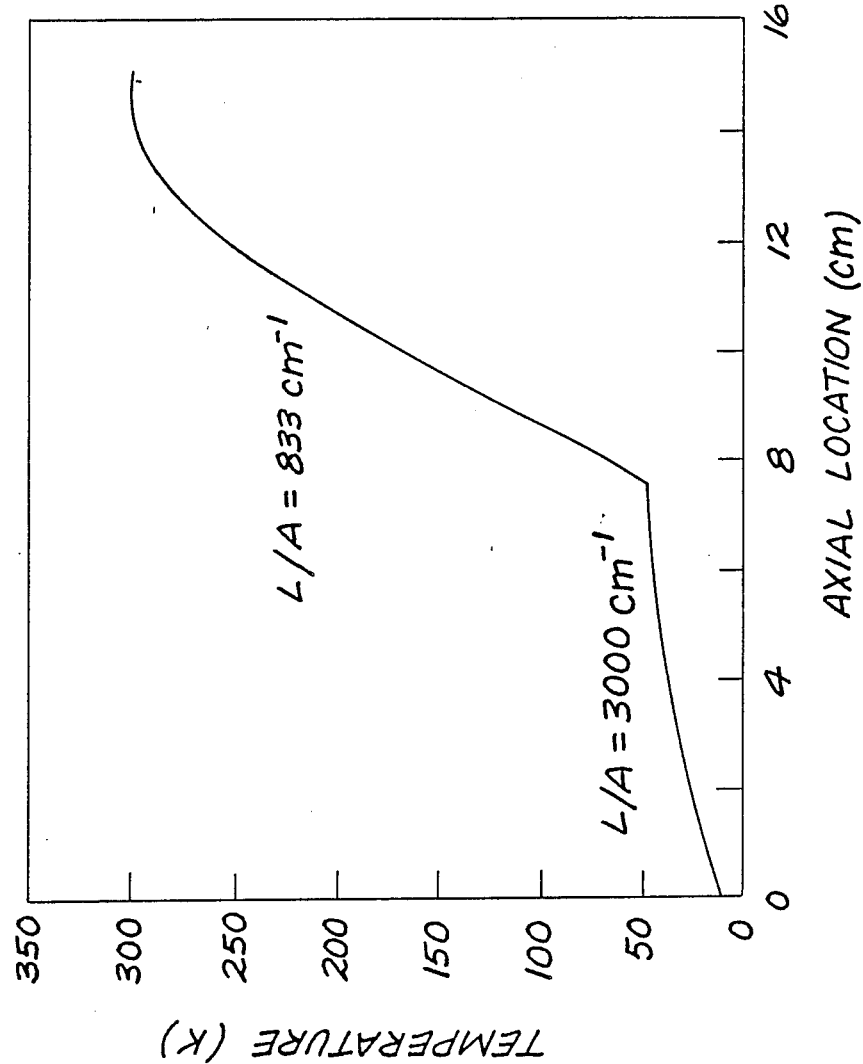
FIG. 25 is a graph showing the temperature distribution in resistive current leads which have an optimized length over area ratio for a given current.

Since the resistance heating of the resistive metallic conductor is directly proportional to the length over cross sectional area, L/A, while conduction heat transfer to a lower temperature heat station is inversely proportional to L/A, there is an optimum L/A for which conduction heat transferred to the lower temperature station is at a minimum. For a resistive lead with nearly constant electrical resistivity along its length, the minimum heat transferred to the low temperature station is equal to one half the resistive heating of the lead section plus the conduction heat transferred from the high temperature station. With the aspect ratio so adjusted, the net heat transferred from the high temperature station is zero since the other half of the resistive heating balances out the conduction heat transferred from that station. The temperature profile of the current leads with optimized aspect ratio for a 50 ampere current is shown in FIG. 25. The slope of the temperature profile of the leads extending between the 10° K. and 50° K. heat station as it approaches the 50° K. heat station is seen to be horizontal signifying that the resistive and conductive heat flows are balanced. Similarly, the slope of the temperature profile of the current leads between the 50° K. heat station and ambient as the lead approaches ambient temperature is horizontal.

If a high temperature ceramic superconductor is used in a lead section from the 50° K. to 10° K. heat station then the resistive heating in that lead section is zero and there is no optimum lead aspect ratio for that section. The ceramic superconductor lead section is made sufficiently large to carry the required current, I, and the lead length is made sufficiently long to result in acceptable conduction heat transfer to the 10° K. heat station. Because of the strong decrease of the material critical current density, $J_c$, with temperature T, the lead cross sectional area, A, must be varied inversely with temperature so that $$A = \frac{I}{J} > \frac{I}{J_c(T)}$$

with sufficient safety margin, $(J_c-J)/J_c$ approximately 10 to 30 percent, where J is the actual current density in the ceramic lead and I is the current.

Figure 26:
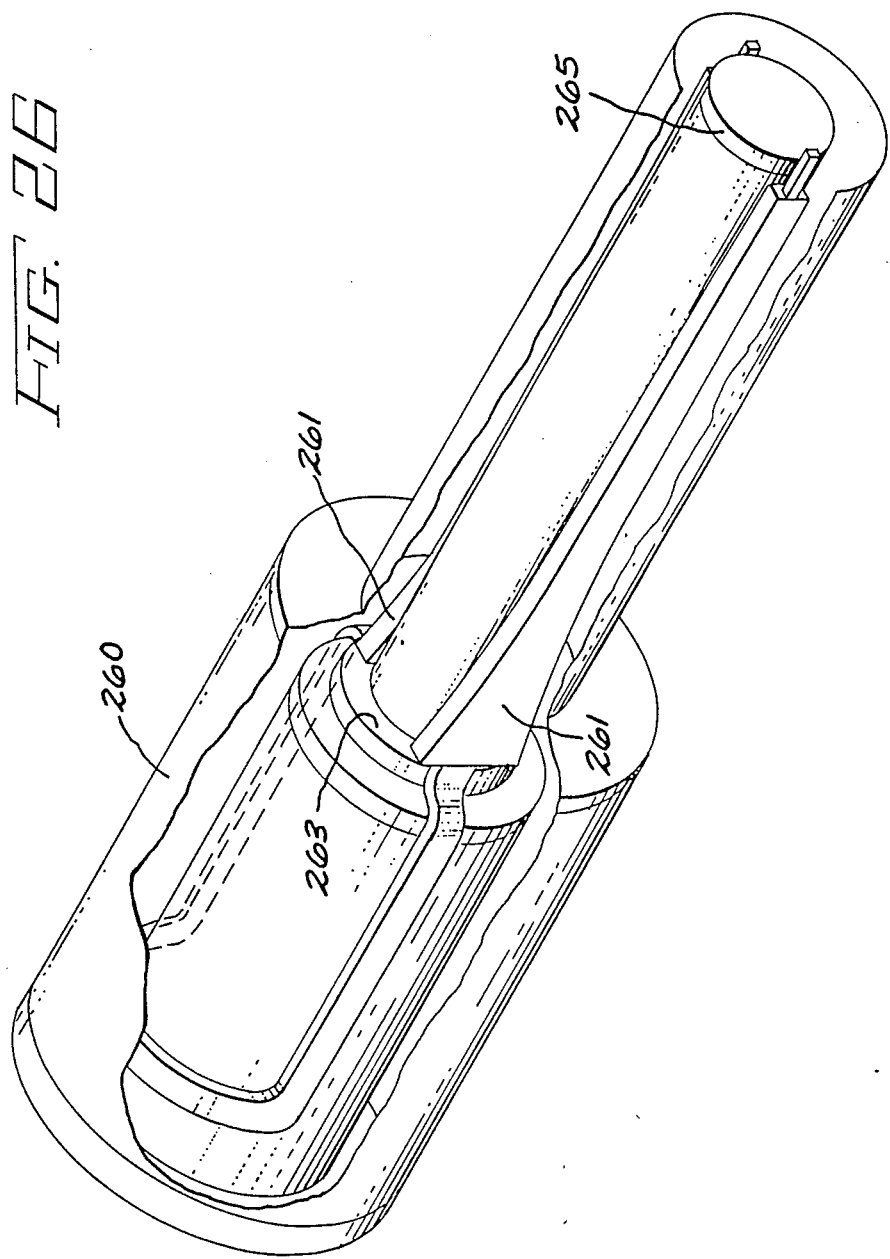
FIG. 26 is a cutaway isometric view of the cold end of a cryocooler having tapered superconductive ceramic leads between the first and section stages.

FIG. 26 shows a cold end portion of a cryocooler sleeve in an evacuated housing 260. Two straight ceramic leads 261 extending from the 50° K. to 10° K. stations 263 and 265, respectively, of a cryocooler sleeve with the leads tapered so that the lead has greater cross sectional area at the warmer end. The ceramic leads are heat stationed at the 50° K. and 10° K. heat stations 263 and 261, respectively. The high temperature section of the lead between the ambient (300° K.) and the 50° K. heat station comprises copper conductors having an optimized L/A to minimize the heat transferred to the 50° K. station at the operating current. Generally, the leads should be metallized with silver. One method is sputtering another is using silver epoxy. The ceramic leads 261 are coated with silver loaded epoxy in the region where current conductive junctions are to be made. During processing of the ceramic, the epoxy is vaporized leaving behind a silver coating to which copper leads can be soldered. Resistive metallic conductors are soldered to the ceramic leads at the 10° K. heat station using low resistivity solder, such as indium solder. The copper leads extending from the ambient are soldered to the ceramic leads in the vicinity of the 50° K. heat station. The ceramic leads can be heat stationed, for example, using beryllia or alumina metallized with copper or nickel on both sides and soldered between the metallized ceramic lead and the cryocooler sleeve heat station. See copending application entitled, "Efficient Thermal Joints For Connecting Current Leads to a Cryocooler", incorporated herein by reference.

Figure 27:
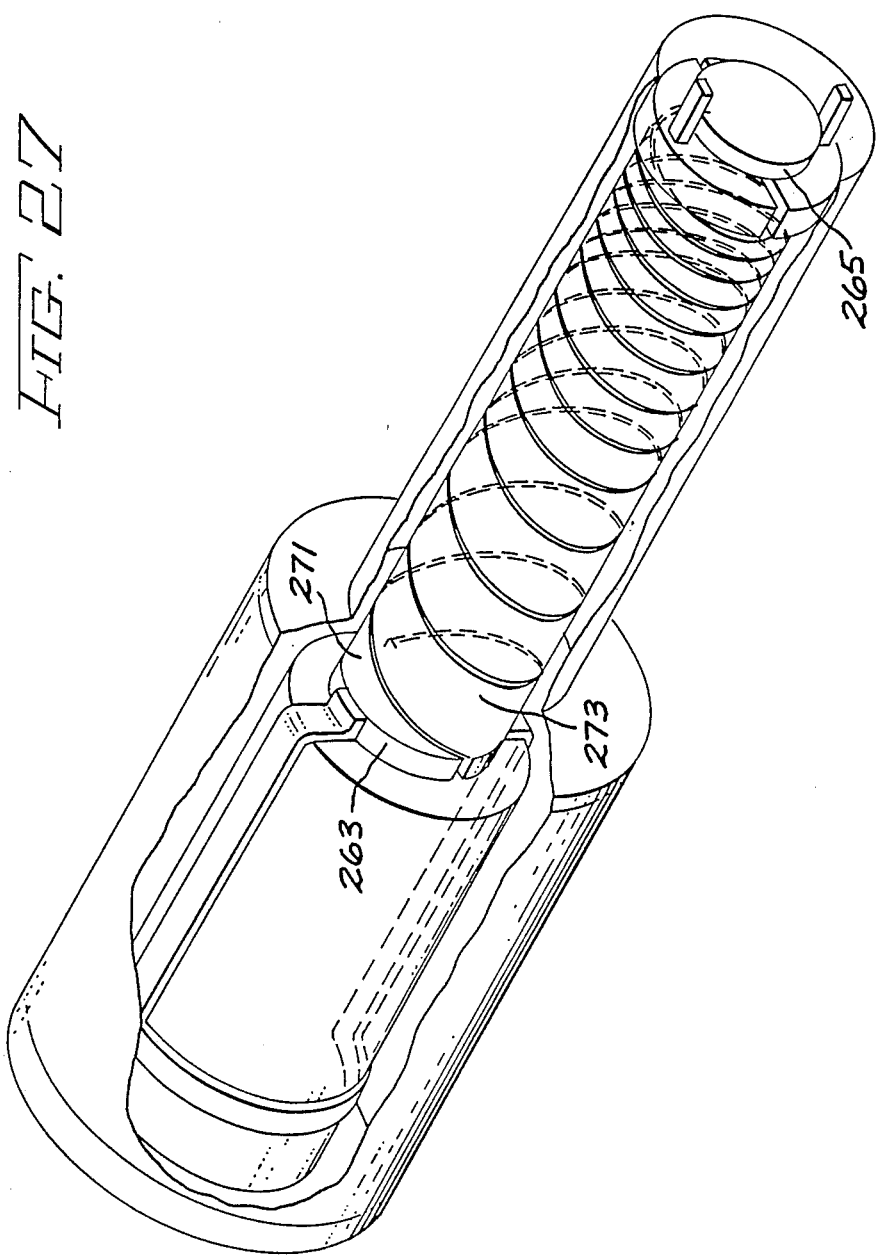
FIG. 27 is a cutaway isometric view of the cold end of a cryocooler with a tapered spiral superconductive current leads between the first and second stages.
Figure 28:
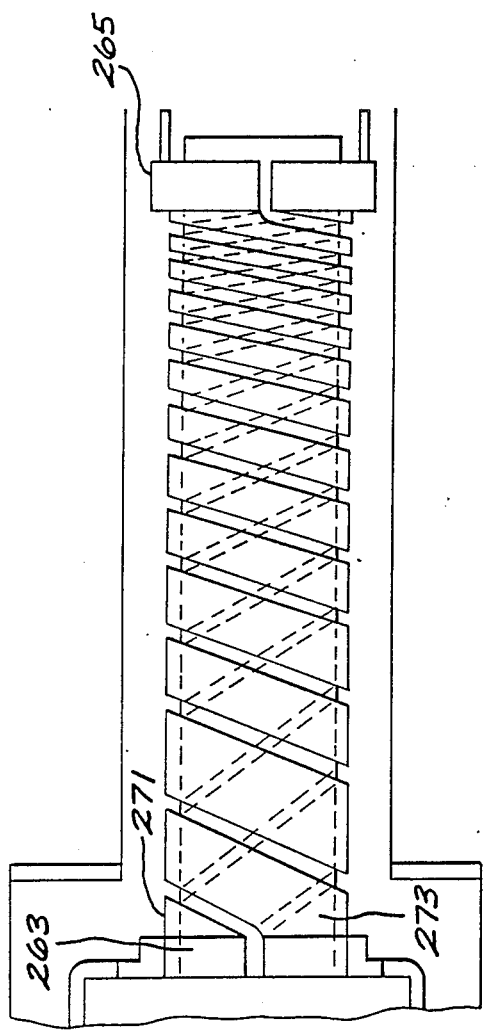
FIG. 28 is a side elevation view of the tapered spiral ceramic superconductive leads of FIG. 27.

FIGS. 27 and 28 show two tapered spiral high temperature ceramic superconductors 271 and 273 which can be formed from a single cylindrical length of ceramic superconductor such as yttrium barium copper oxide ($YBa_2Cu_3O_x$). The ceramic leads extend from the 50° K. to 10° K. heat station 163 and 165, respectively, and are heat stationed at the 50° K. and 10° K. heat stations. The ceramic leads are metallized with silver, such as by coating them with silver loaded epoxy which during heating leaves a coating of silver behind allowing the resistive metallic conductors to be soldered to the silver coated ceramic leads at the 10° K. heat station. A low resistance solder such as indium solder is preferably used. The current leads each from ambient temperature are soldered to the ceramic leads in the vicinity of the 50° K. heat station.

Thus, the cryocooler in the sleeve which is thermally coupled to the magnet cryostat temperature stations at 10° K., and 50° K., will experience negligible heat load from the current leads at the 10° K. station, when the optimized aspect ratio resistive metallic conductors or the ceramic superconductors are used. The cooling capacity at the 10° K. station is limited and the heat station receives negligible heat load from the current leads, while the lead thermal load at the 50° K. heat station can be easily handled by the increased refrigeration capacity available at this temperature.

Power is supplied to the magnets in the present invention by permanently connected leads supplied from a stable power supply. The power supply provides power lost due to the resistance in copper bus bars current leads and superconductor splices. To prevent arcing from occurring in case the leads become accidently disconnected or if a ceramic superconducting lead quenches, diodes are connected in the magnet to provide a continuous current path. During operation with the current leads connected and operating properly the voltage across the diodes is insufficient to cause them to conduct. If the leads current is interrupted, the voltage across the diode increases causing them to conduct.

Joints made in niobium tin superconductor wire are nonsuperconductive but have a very low resistance. Using only superconductive wire and no copper bus bars, or permanently connected leads, the magnet resistance would be approximately $10^{-8}$ ohms. The inductance of the magnet depends on magnet strength varying from 160 to 1600 henries for the embodiments shown. Once a current is established in the superconducting coils, the long time constant of the magnet circuit (thousands of years) could provide virtually persistent operation and a stable field in the magnet.

While the invention has been particularly shown and described with reference to several embodiments thereof, it will be understood by those skilled in the art that various changes in form and detail may be made without departing from the spirit and scope of the invention.

What is claimed is:

1. A magnetic resonance magnet comprising:
a vacuum vessel;
a cylindrical coil form having superconductor windings supported from said vacuum vessel, said coil form having a plurality of circumferentially spaced apertures extending from the surface of the cylindrical coil form inward;
a radiation shield surrounding said coil form and spaced away therefrom; and
spacer means situated partially in said apertures, spaced away from the aperture walls and secured at one end to said coil form, said spacer means protruding radially beyond the coil form surface and contacting said shield, the length of said spacer means being greater than the distance between the surface of the coil form and the shield thereby increasing the thermal conduction path length between coil form and shield.

2. The magnetic resonance magnet of claim 1 wherein said spacer means is radially adjustably secured to said coil form.

3. The magnetic resonance magnet of claim 1 wherein said spacer comprises a cylindrical shell of thermal insulating material having disc shaped inserts secured in either open end of the shell.

4. The magnetic resonance magnet of claim 1 wherein said coil form has a plurality of circumferentially spaced apertures extending from the interior surface outwards and from the ends of the cylindrical coil form axially inwards, the apertures having spacer means situated partially in said apertures, spaced away from the aperture walls and secured at one end the coil form, said spacer means protruding away from the coil form and contacting said shield.

* * * * *